United States Patent
Kobayashi et al.

(10) Patent No.: US 9,267,622 B2
(45) Date of Patent: Feb. 23, 2016

(54) ELECTRICAL CABLE HOLDER

(75) Inventors: Shuichi Kobayashi, Toyoda (JP); Yasuhiko Inoue, Toyonaka (JP)

(73) Assignees: NIFCO INC., Yokohama-shi, Kanagawa (JP); YANEGIKEN CO., LTD., Takahama-shi, Aichi (JP)

( * ) Notice: Subject to any disclaimer, the term of this patent is extended or adjusted under 35 U.S.C. 154(b) by 228 days.

(21) Appl. No.: 13/876,987

(22) PCT Filed: Sep. 20, 2011

(86) PCT No.: PCT/JP2011/071386
§ 371 (c)(1),
(2), (4) Date: Apr. 26, 2013

(87) PCT Pub. No.: WO2012/043306
PCT Pub. Date: Apr. 5, 2012

(65) Prior Publication Data
US 2013/0206929 A1    Aug. 15, 2013

(30) Foreign Application Priority Data
Sep. 30, 2010 (JP) ................................ 2010-222564

(51) Int. Cl.
*F16L 3/08* (2006.01)
*F16L 3/02* (2006.01)
(Continued)

(52) U.S. Cl.
CPC . *F16L 3/02* (2013.01); *H01L 31/05* (2013.01); *H02G 3/32* (2013.01); *H02S 40/36* (2014.12); *F16B 2/10* (2013.01); *F16B 21/088* (2013.01); *Y02E 10/50* (2013.01)

(58) Field of Classification Search
CPC ........... F16L 3/02; F16L 3/1218; F16L 3/137; F16L 3/1025; F16L 3/1058; F16L 3/1075; F16L 3/1091; F16L 3/00; F16L 3/127; F16L 3/233; F16B 2/10; F16B 21/088; H01L 31/05; H02G 3/32; Y02E 10/50; H05K 3/301; H05K 3/222; H05K 13/06; H05K 2201/10606; H05K 2201/10287; H05K 7/12
USPC ................. 248/74.1, 71, 73, 68.1, 67, 229.13, 248/229.23, 230.4, 231.51; 174/168, 135
See application file for complete search history.

(56) References Cited

U.S. PATENT DOCUMENTS 3,523,669 A * 8/1970 Avallone .......................... 248/73
5,020,749 A   6/1991 Kraus
(Continued)

FOREIGN PATENT DOCUMENTS

EP       0421055 A2    4/1991
JP     H01-163279 U   11/1989
(Continued)

OTHER PUBLICATIONS

Europe Patent Office, "Search Report for EP 11828863.8," Mar. 19, 2014.

*Primary Examiner* — Anita M King
(74) *Attorney, Agent, or Firm* — Manabu Kanesaka

(57) ABSTRACT

An electrical cable holder has a holder body having a fixing device (for example, anchor part) and a fastening part positioned beneath the fixing device (for example, anchor part) for provisionally placing an electrical cable (for example, power transmission cable); and a movable arm movably supported on the holder body for fastening the electrical cable (for example, power transmission cable) provisionally placed in the fastening part, between the movable arm and the fastening part. A lock device for locking the movable arm in a fastening state, in which the electrical cable (for example, power transmission cable) is fastened by the fastening part, is provided between the movable arm and the fastening part. A stationary device for maintaining a non-fastening state is provided between the holder body and the movable arm.

7 Claims, 23 Drawing Sheets

(51) Int. Cl.
  *H02G 3/32* (2006.01)
  *H01L 31/05* (2014.01)
  *H02S 40/36* (2014.01)
  *F16B 2/10* (2006.01)
  *F16B 21/08* (2006.01)

(56) References Cited

U.S. PATENT DOCUMENTS

| | | | | |
|---|---|---|---|---|
| 5,305,978 | A * | 4/1994 | Current | 248/230.4 |
| 5,367,750 | A * | 11/1994 | Ward | 24/16 PB |
| 5,622,341 | A | 4/1997 | Stana | |
| 6,206,331 | B1 * | 3/2001 | Keith et al. | 248/74.1 |
| 6,561,471 | B1 | 5/2003 | Hawie | |
| 7,805,814 | B2 * | 10/2010 | Cho | 24/16 PB |
| 8,015,759 | B1 * | 9/2011 | Bruce | 52/146 |
| 8,132,764 | B2 * | 3/2012 | Kuipers | 248/74.3 |
| D661,177 | S * | 6/2012 | Kobayashi et al. | D8/356 |
| 8,317,526 | B2 * | 11/2012 | Gardner et al. | 439/100 |
| 8,408,507 | B2 * | 4/2013 | Liu | 248/230.4 |
| 2004/0163338 | A1 | 8/2004 | Liebendorfer | |
| 2007/0157963 | A1 | 7/2007 | Metten et al. | |
| 2008/0121273 | A1 * | 5/2008 | Plaisted et al. | 136/251 |
| 2014/0157557 | A1 * | 6/2014 | Diep et al. | 24/519 |

FOREIGN PATENT DOCUMENTS

| | | |
|---|---|---|
| JP | H06-65652 U | 9/1994 |
| JP | H11-153113 A | 6/1999 |
| JP | 2001-235065 A | 8/2001 |
| JP | 2006-067758 A | 3/2006 |
| JP | 2006-166573 A | 6/2006 |
| JP | 2007-231998 A | 9/2007 |
| JP | 2008-240789 A | 10/2008 |

* cited by examiner

ELECTRICAL CABLE HOLDER

TECHNOLOGICAL FIELD

The present invention relates to an electrical cable holder, with which an electrical cable, for example, a power transmission cable of a solar panel placed on a roof, can be wired while being provisionally placed in a fastening part of a holder body, and a movable arm standing in a non-fastening state is made movable toward the fastening part after wiring the cable, whereby the electrical cable can be locked in a fastened state being fastened by the fastening part.

BACKGROUND TECHNOLOGY

A clamp is conventionally known, in which a ratchet arm is fixed by shaft to a body having a U-shaped clamp opening having an open upper side, and a conduit is held in the clamp opening by rotating the ratchet arm toward the clamp opening and engaging with teeth provided on the inner perimeter of the clamp opening (see Patent Document 1, page 9, line 6 to page 10, line 4; page 11, line 29 to page 12, line 12; and FIGS. 1 and 7a to 7d).

PRIOR ART DOCUMENTS

Patent Documents

Patent Document 1: Japanese Patent Publication No. H8-500420

SUMMARY OF THE INVENTION

Problem to be Solved by the Invention

However, because the aforementioned conventional clamp is formed in a U-shape with the clamp opening open on the upper side, there is a problem that the conduit falls when the clamp opening is attached facing downward and the ratchet arm must be closed while holding the conduit by hand so that it does not fall.

That is, with the abovementioned conventional clamp, there is a drawback that the operating efficiency is inferior because the conduit cannot be provisionally held when the clamp opening is attached facing downward.

Therefore, the present invention has been made in consideration of the abovementioned problem of the prior art, and an object thereof is to be capable of wiring while provisionally placing the cable, and to be capable of fixing the electrical cable by moving a movable arm after wiring the cable.

Means for Solving the Problem

The present invention was created in order to achieve the abovementioned object, and an electrical cable holder according to a first aspect of the present invention is characterized by the following points.

Firstly, the electrical cable holder is for fixing an electrical cable (for example, power transmission cable) to an attachment-receiving object (for example, metal stay).

Secondly, the electrical cable holder has the following configuration.

(1) Holder Body

The holder body has fixing means (for example, anchor part) for fixing to the attachment-receiving object (for example, metal stay), and a fastening part positioned beneath the fixing means (for example, anchor part) for provisionally placing the electrical cable (for example, power transmission cable).

(2) Movable Arm

The movable arm is movably supported on the holder body, and is for fastening the electrical cable (for example, power transmission cable) provisionally placed in the fastening part, between the movable arm and the fastening part.

Thirdly, lock means (for example, engagement between a ratchet and a lock claw) for locking the movable arm in a fastening state, in which the electrical cable (for example, power transmission cable) is fastened by the fastening part, is provided between the movable arm and the fastening part.

Fourthly, stationary means (for example, frictional resistance between a support arm and a neck part) for maintaining a non-fastening state is provided between the holder body and the movable arm.

The electrical cable holder according to a first aspect of the present invention may be characterized by the following points.

Firstly, an attachment hole for fixing the fixing means (for example, anchor part) is provided on the attachment-receiving object (for example, metal stay).

Secondly, the fixing means (for example, anchor part) is made such that an attachment for accommodating variation of shape of the attachment hole can be attached.

With this configuration, fixing is made possible in various kinds of attachment holes having different shapes by attaching the attachment to the fixing means.

The electrical cable holder according to a first aspect of the present invention may be characterized by the following points.

Firstly, either one of a shaft part or a shaft hole is provided on each one of the holder body and the movable arm for movably supporting the movable arm.

Secondly, the shaft part and the shaft hole contact closely to each other in the fastening state.

With this configuration, rattling between the holder body and the movable arm can be prevented by the close contact between the shaft part and the shaft hole of the holder body and the movable arm in the fastening state of the electrical cable.

The electrical cable holder according to a second aspect of the present invention may be characterized by the following points.

Firstly, the electrical cable holder is for fixing to an attachment-receiving object (for example, metal stay) an electrical cable (for example, power transmission cable) wired between a structural object (for example, roof member) and a stationary object (for example, solar panel) attached maintaining a distance above the structural object.

Secondly, the electrical cable holder has the following configuration.

(1) Holder Body

The holder body has fixing means (for example, anchor part) for fixing to the stationary object (for example, solar panel), and a fastening part positioned beneath the fixing means (for example, anchor part) for allowing provisional placement of the electrical cable (for example, power transmission cable).

(2) Movable Arm

The movable arm is movably supported on the holder body, and is for fastening the electrical cable (for example, power transmission cable) provisionally placed in the fastening part, between the movable arm and the fastening part.

Thirdly, lock means (for example, engagement between a ratchet and a lock claw) for locking the movable arm in a fastening state, in which the electrical cable (for example, power transmission cable) is fastened by the fastening part, is provided between the movable arm and the fastening part.

Fourthly, the movable arm rotates while maintaining a gap with the structural object (for example, roof member) in a state being most proximal to the structural object (for example, roof member).

The electrical cable holder according to a second aspect of the present invention may be characterized by the following points.

Firstly, the structural object is a roof member.

Secondly, the stationary object is a solar panel or a mount (for example, metal stay) for attaching the solar panel.

With this configuration, an electrical cable holder that is ideal for wiring cables of solar panels fixed to roof members can be provided.

Effects of the Invention

According to the electrical cable holder according to the first aspect of the present invention, an electrical cable can be wired while being provisionally placed in the fastening part of the holder body, and the movable arm standing in the non-fastening state is made movable toward the fastening part after wiring the cable, whereby the electrical cable can be locked in the fastened state being fastened by the fastening part.

According to the electrical cable holder according to the second aspect of the present invention, an electrical cable can be provisionally placed between a structural object and a stationary object attached above the structural object and wiring while maintaining a space. After wiring, by rotating the movable arm within the distance between the structural object and the stationary object, the electrical cable can be fixed between the structural object and the stationary object through the electrical cable holder.

EMBODIMENTS OF THE INVENTION

First Embodiment

A first embodiment of the present invention is described using FIGS. 1 to 21.

(Electrical Cable Holder 10)

A first embodiment of the present invention is described using FIGS. 1 to 21.

Figure 1:
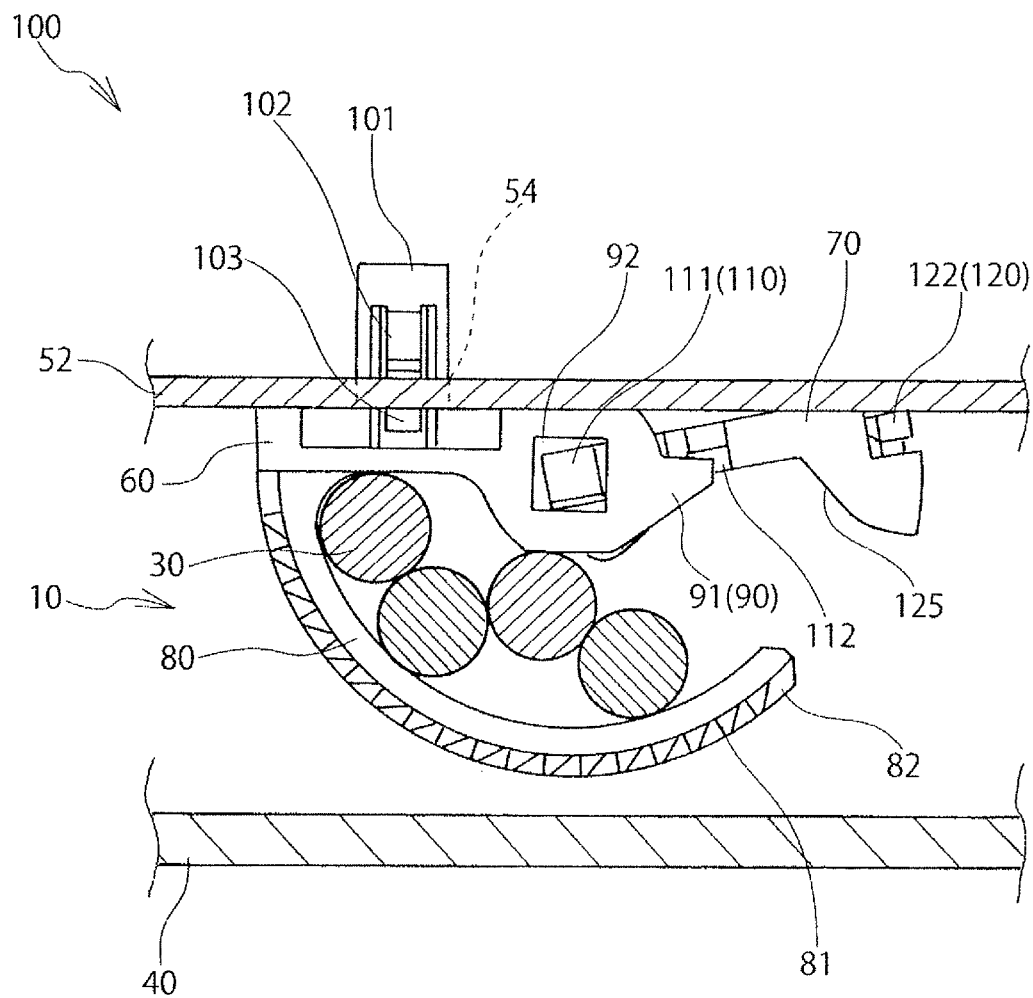
FIG. 1 is a cross-sectional view of the electrical cable holder in the state in which a cable is provisionally placed, illustrating the first embodiment of the present invention.
Figure 2:
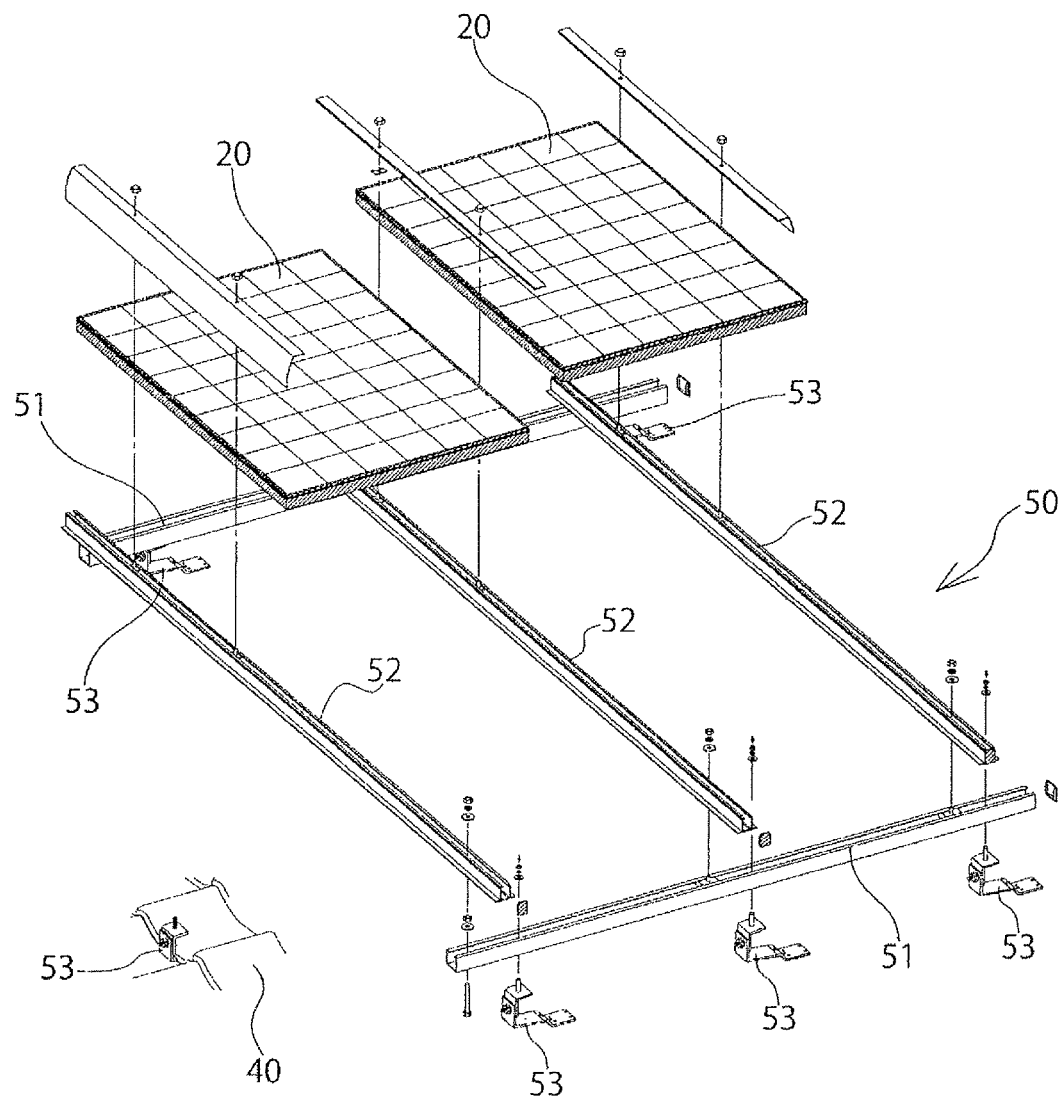
FIG. 2 is an exploded perspective view and a partially enlarged perspective view of the installed state of a solar panel, illustrating the first embodiment of the present invention.

In FIG. 1, numeral "10" refers to an electrical cable holder 10, which is used, for example, for wiring a power transmission cable 30 (electrical cable, hereinafter referred to also as "cable 30") of a solar panel 20 (one example of a stationary object), as illustrated in FIG. 2.

The solar panel 20 is fixed to a tile or other roof member 40 (structural object) by means of a metal stay 50 (attachment-receiving object), as illustrated in FIG. 2.

The metal stay 50 is fixed to the roof member 40 through the support fittings 53, with horizontal crosspieces 52 being distributed across a plurality of vertical crosspieces 51, as illustrated in FIG. 2.

Figure 18:
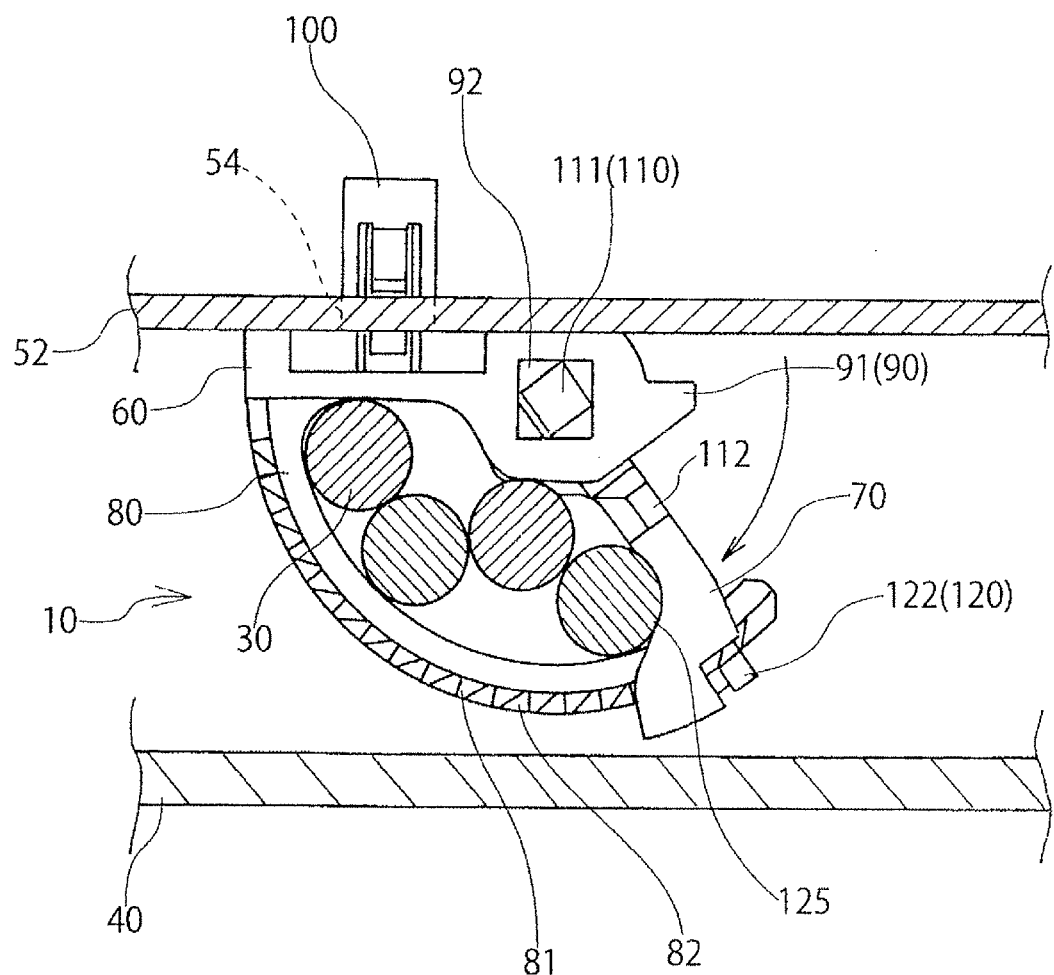
FIG. 18 is a cross-sectional view of the electrical cable holder in the state in which the movable arm is rotated downward, corresponding to FIG. 1.
Figure 19:
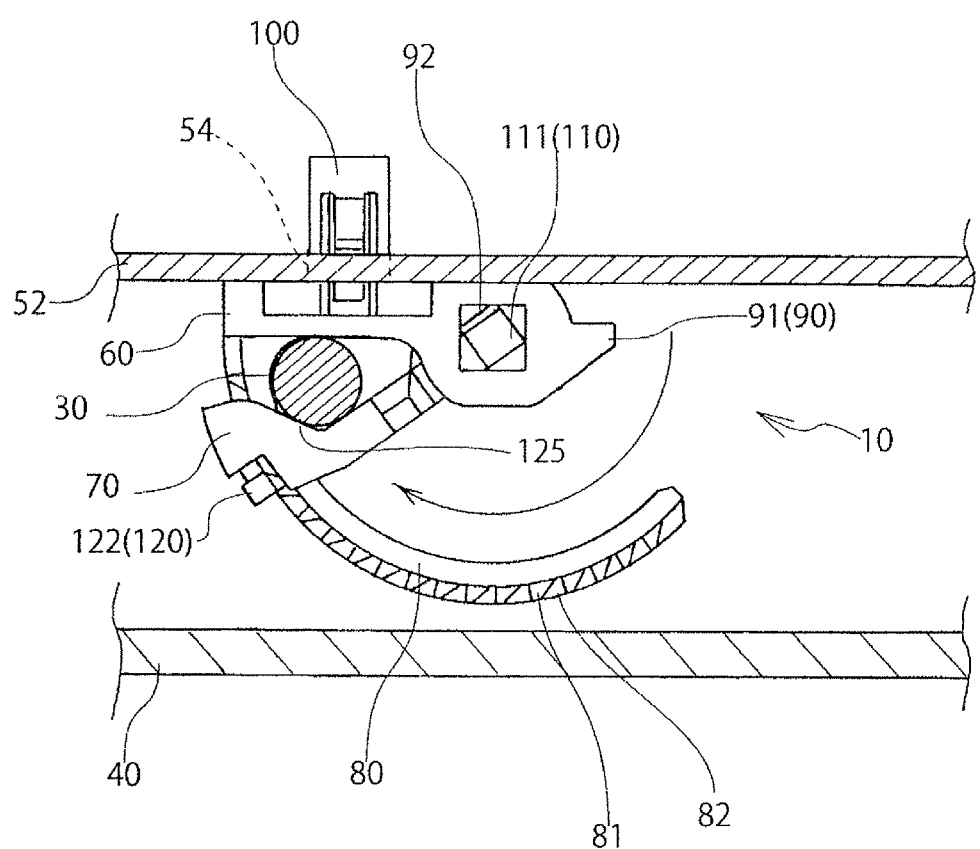
FIG. 19 is a cross-sectional view of the electrical cable holder in the state in which one cable is fastened.

The solar panel 20 is fixed to the horizontal crosspiece 52, as illustrated in FIG. 2. The power transmission cable 30, although not illustrated, is wired along the horizontal crosspiece 52, and is fixed to the horizontal crosspiece 52 by way of the electrical cable holder 10, as illustrated in FIG. 18.

The horizontal crosspieces 52 are fixed to the roof member 40 through the vertical crosspieces 51, and are attached maintaining a distance above the roof member 40, as illustrated in FIG. 2. An attachment hole 54 for attaching the electrical cable holder 10 is provided on the horizontal crosspiece 52, as illustrated in FIG. 1. The attachment hole 54 runs through the horizontal crosspiece 52 from top to bottom, and is formed, for example, in a circular shape.

The attachment hole 54 is formed in a circular shape, but the present invention is not limited to this, and the attachment hole may be formed in a square shape or other noncircular shape.

Also, the solar panel 20 is illustrated as an example of the stationary object, but the present invention is not limited to this, and the stationary object may be a mount, for example, the metal stay 50, for attaching the solar panel 20.

Furthermore, the power transmission cable 30 is illustrated as an example of the electrical cable and the roof member 40 is illustrated as an example of the structural object, but the present invention is not limited to these. Furthermore, the metal stay 50 is illustrated as an example of the mount for attaching the solar panel 20, but the present invention is not limited to this; and the vertical crosspieces 51, horizontal crosspieces 52, and support fittings 53 are illustrated as examples of the metal stay 50, but the present invention is not limited to these.

Figure 3:
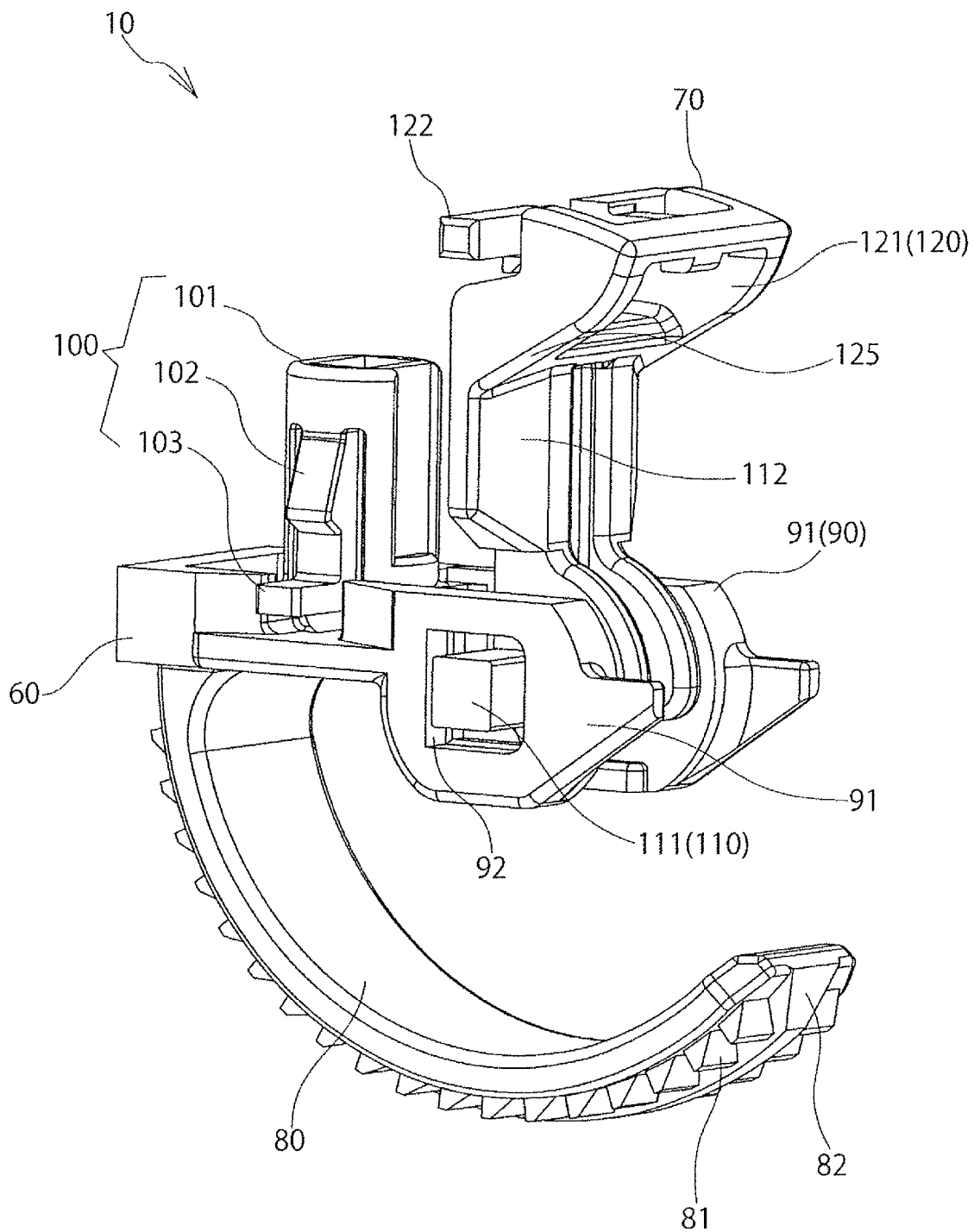
FIG. 3 is a perspective view of the electrical cable holder, illustrating the first embodiment of the present invention.
Figure 4:
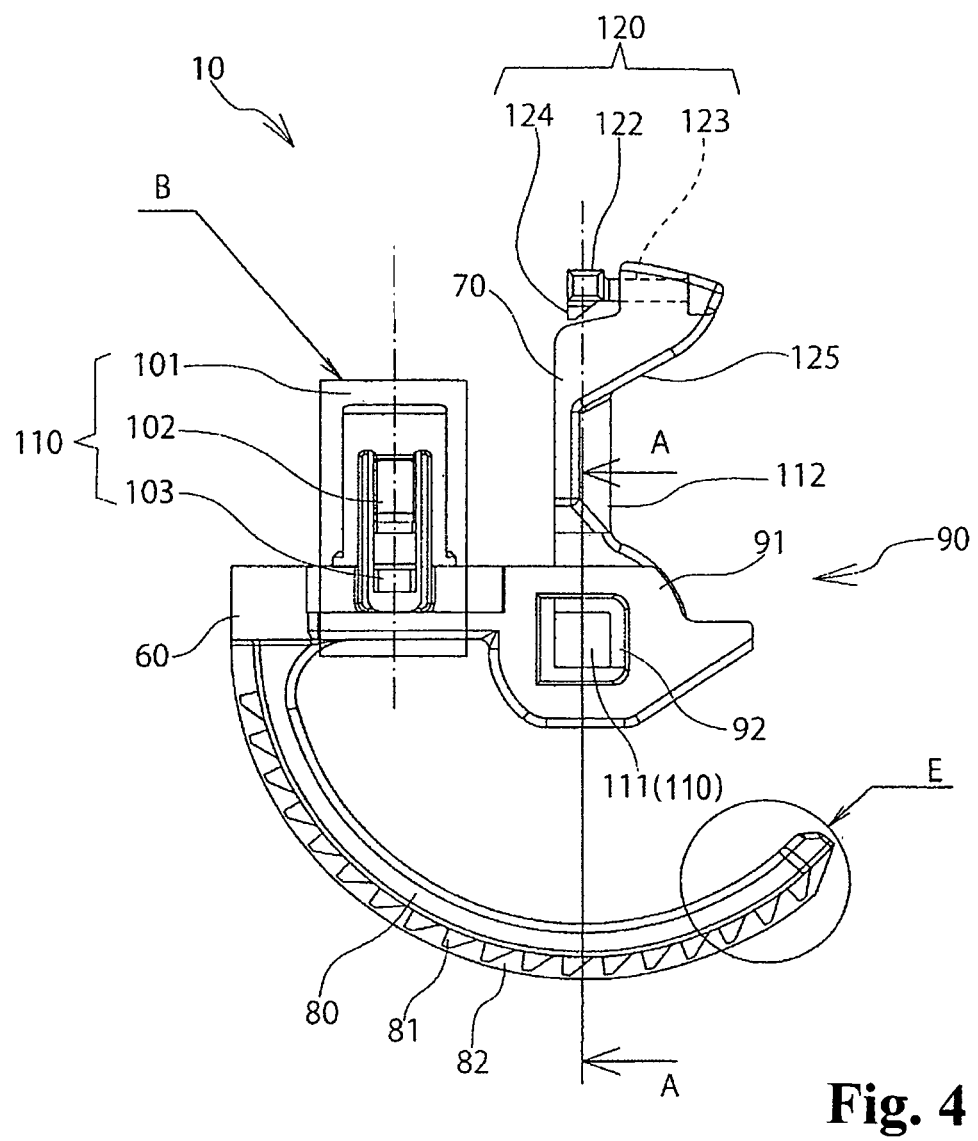
FIG. 4 is a front view of the electrical cable holder.
Figure 5:
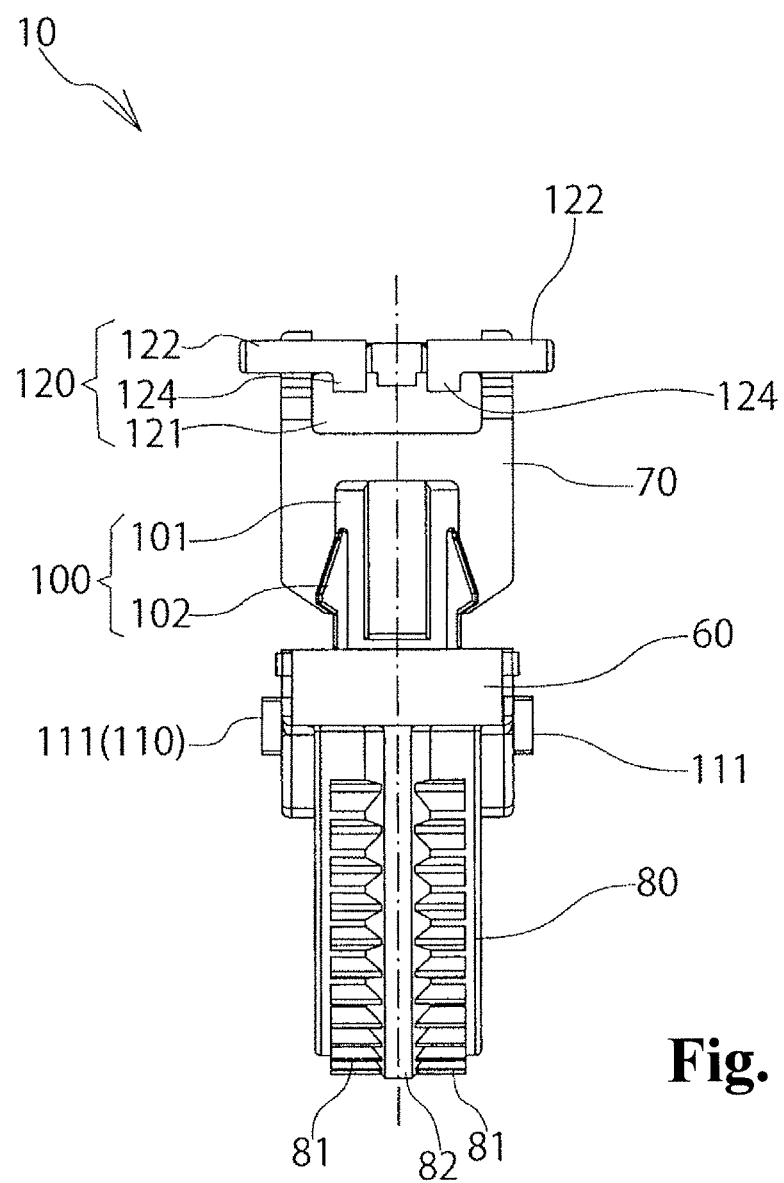
FIG. 5 is a left side view of the electrical cable holder.
Figure 6:
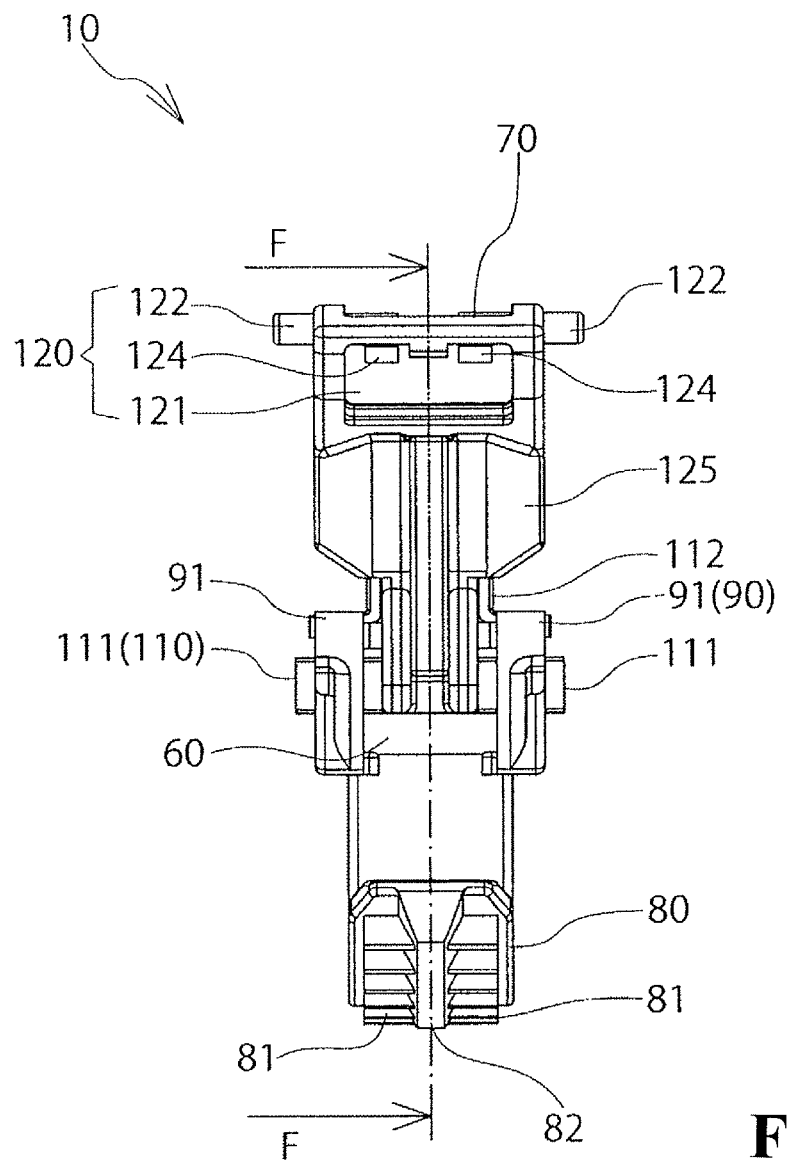
FIG. 6 is a right side view of the electrical cable holder.
Figure 7:
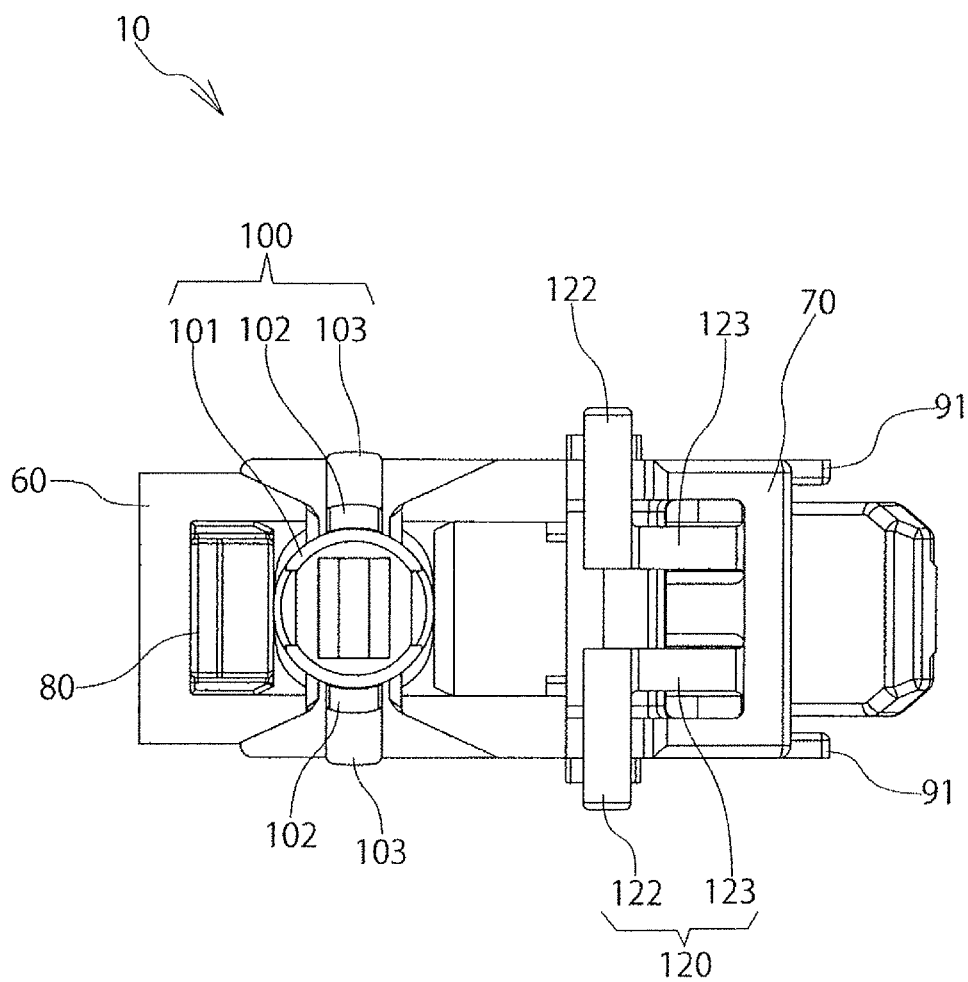
FIG. 7 is a plan view of the electrical cable holder.
Figure 8:
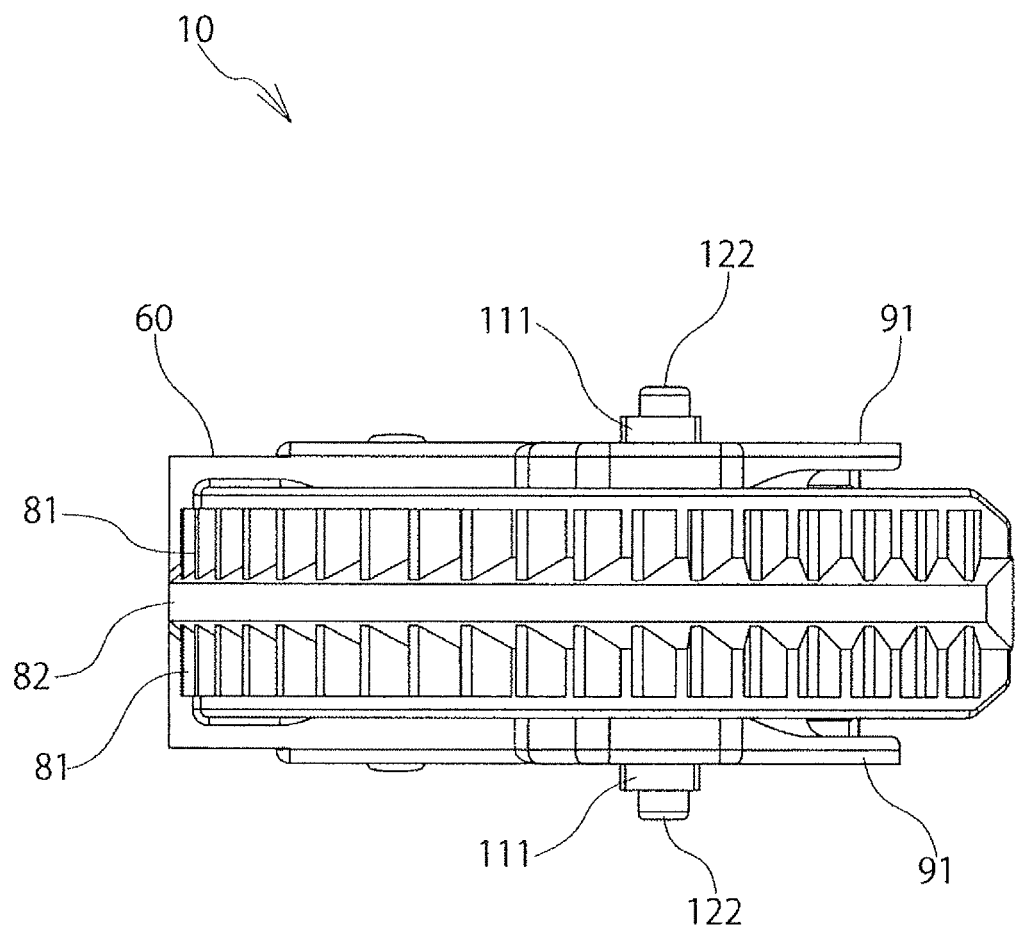
FIG. 8 is a bottom view of the electrical cable holder.
Figure 9:
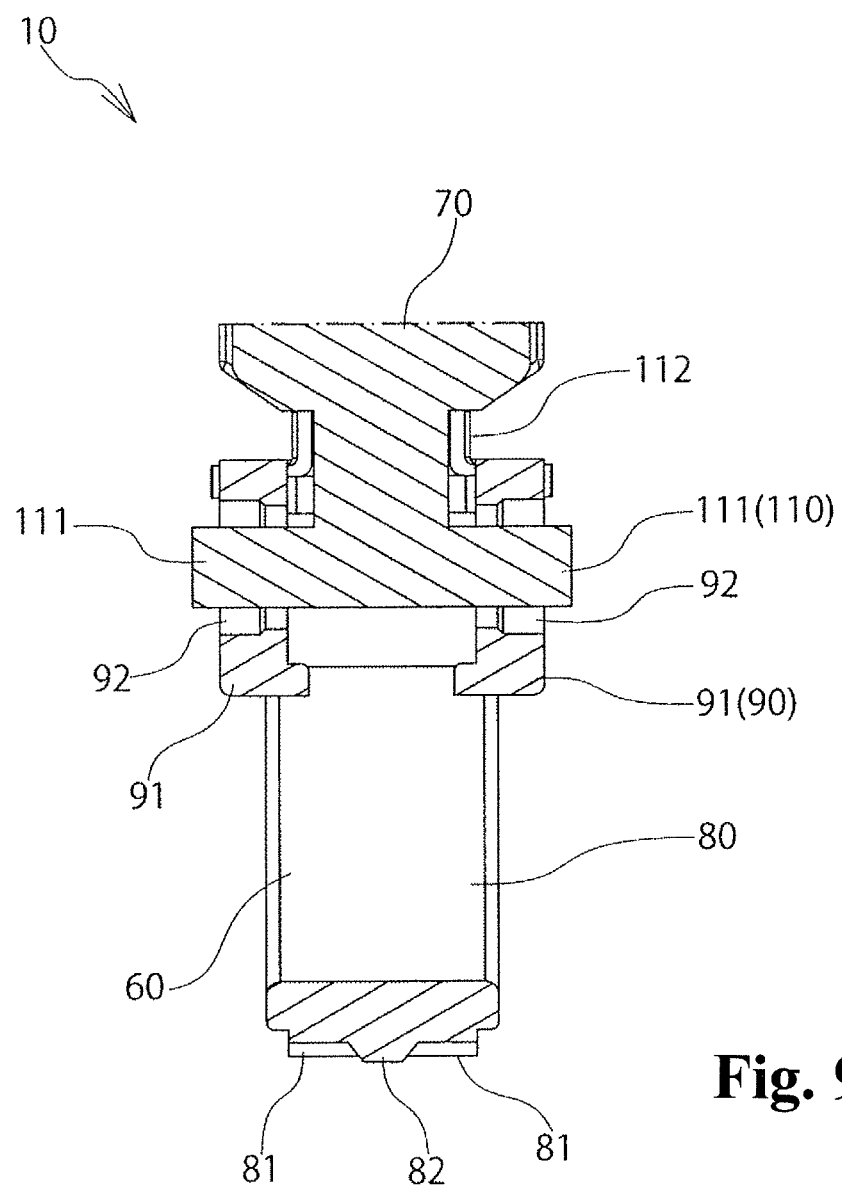
FIG. 9 is a cross-sectional view along the line A-A in FIG. 4.
Figure 10:
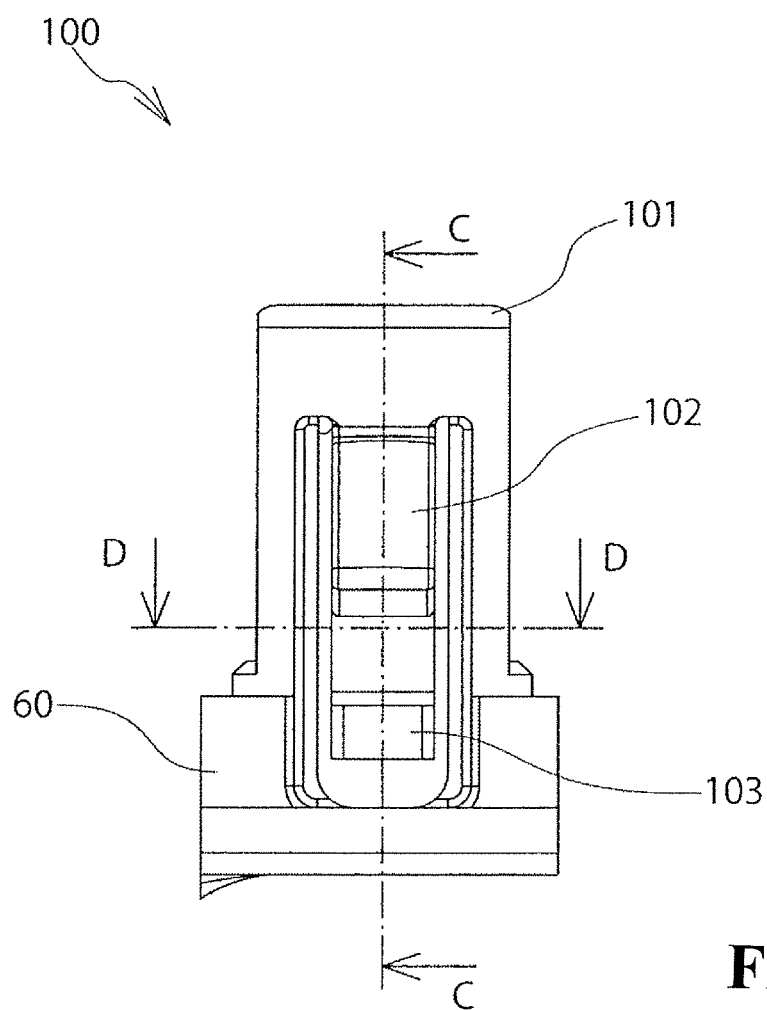
FIG. 10 is an enlarged view of portion B in FIG. 4.
Figure 11:
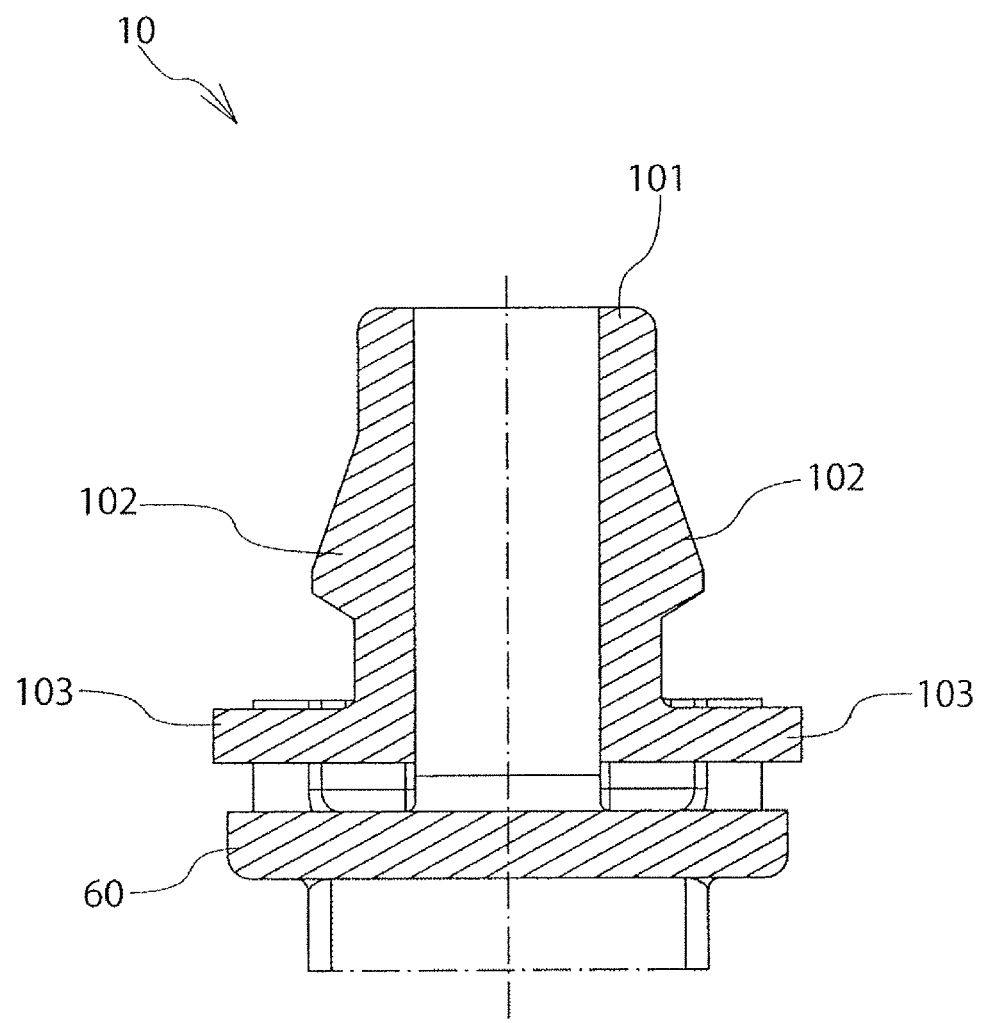
FIG. 11 is a cross-sectional view along the line C-C in FIG. 10.
Figure 12:
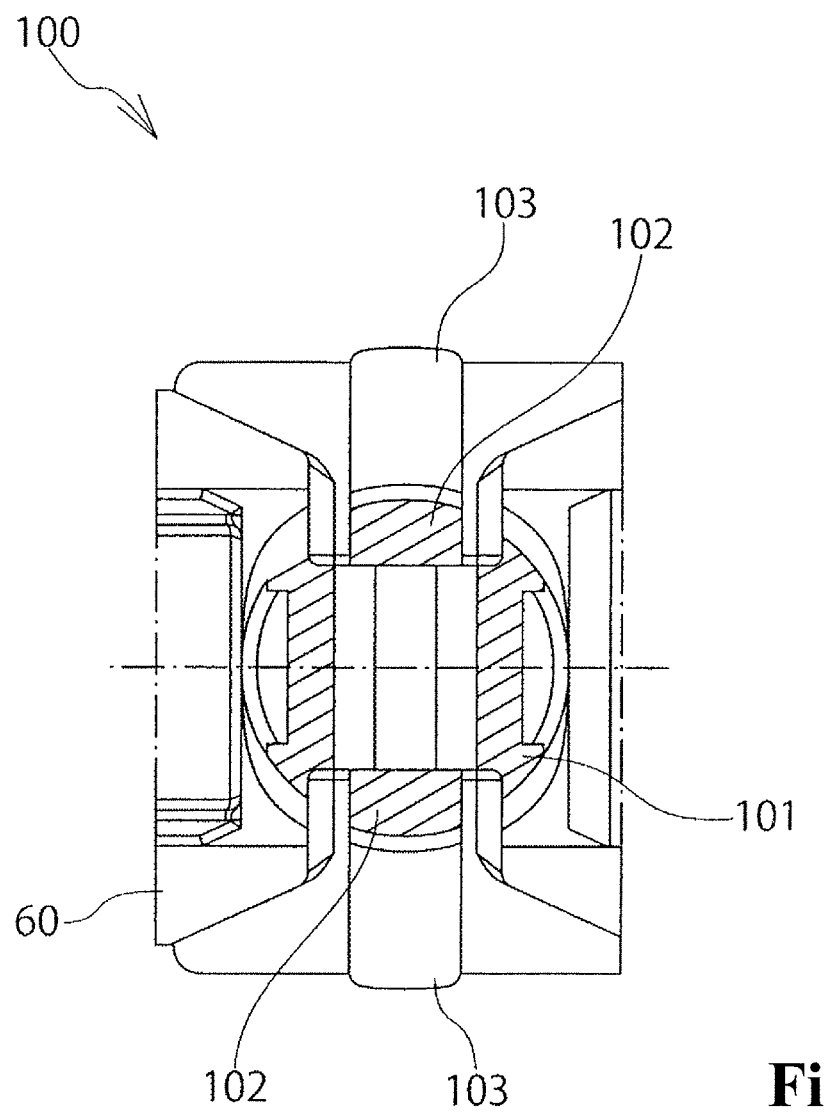
FIG. 12 is a cross-sectional view along the line D-D in FIG. 10.
Figure 13:
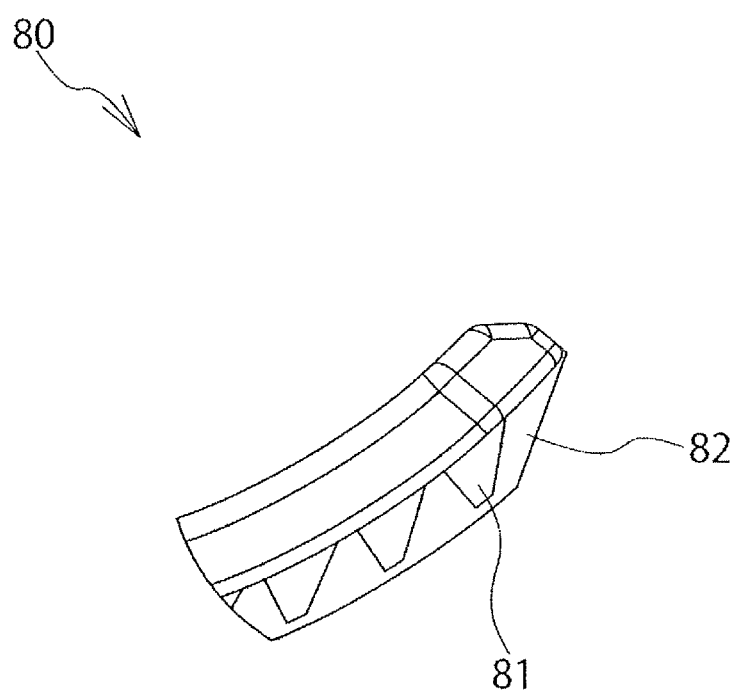
FIG. 13 is an enlarged view of portion E in FIG. 4.
Figure 14:
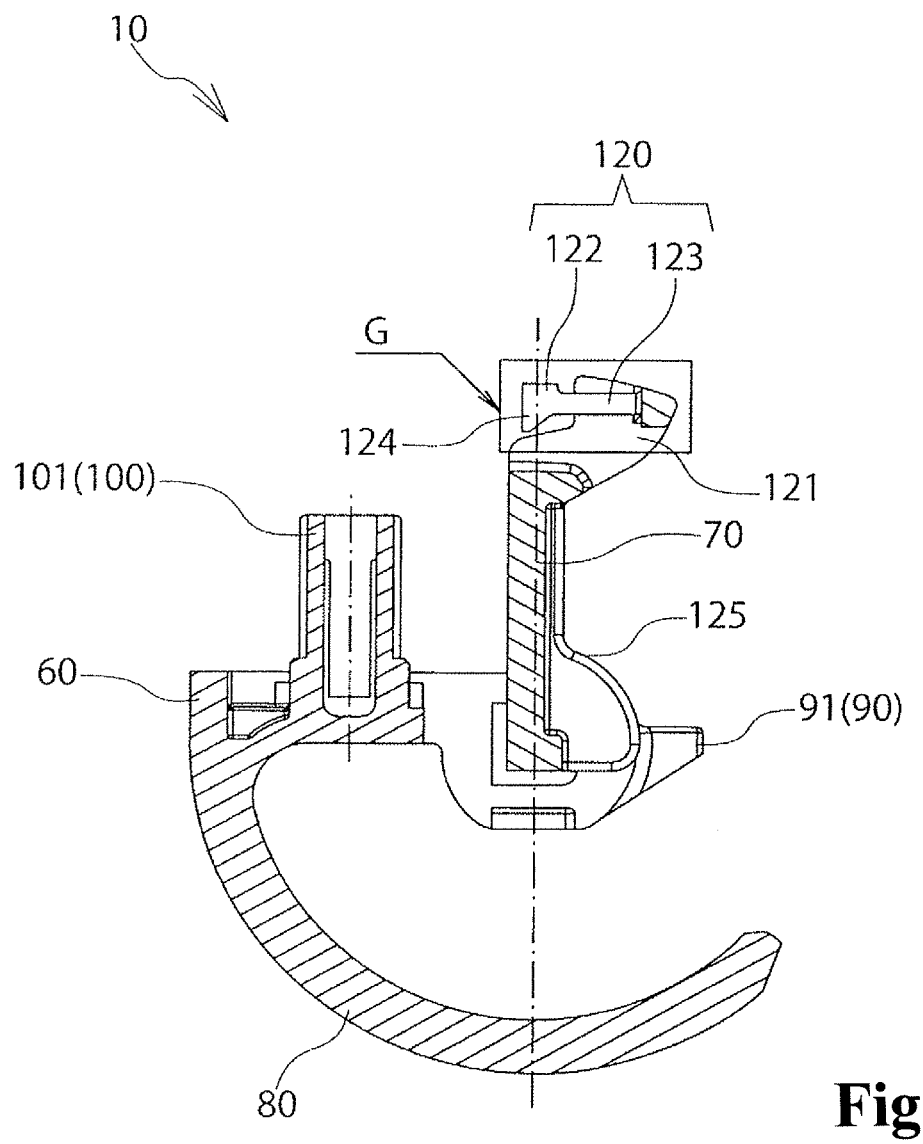
FIG. 14 is a cross-sectional view along the line F-F in FIG. 6.
Figure 15:
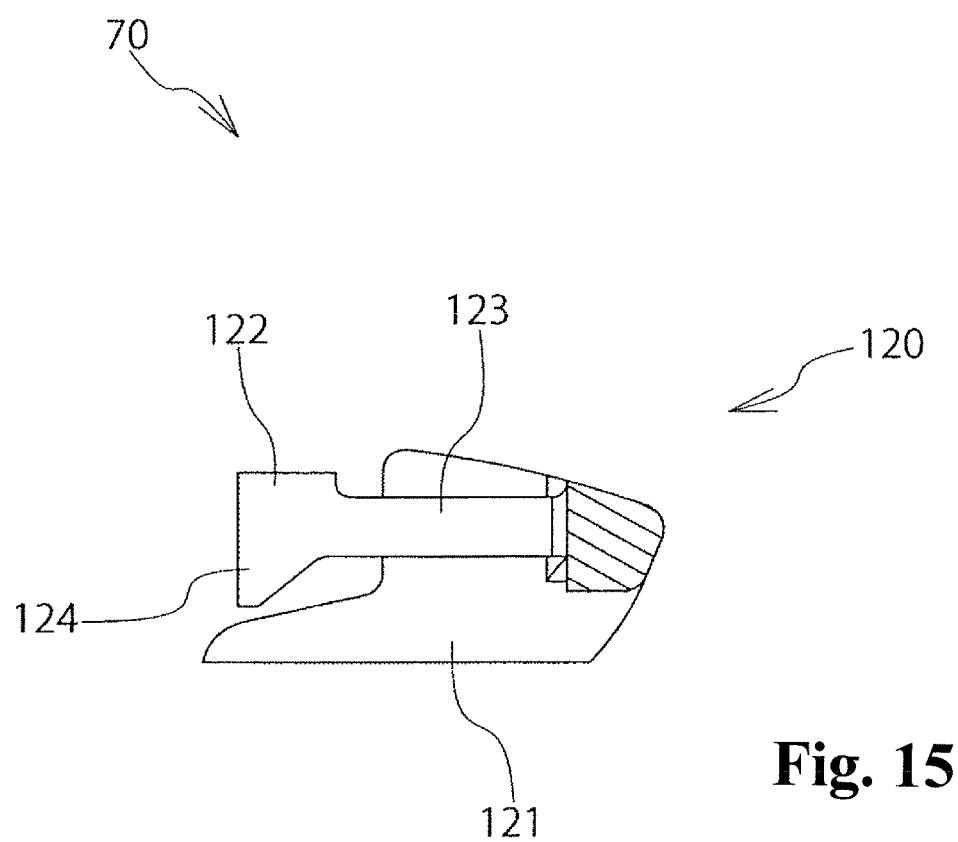
FIG. 15 is an enlarged view of portion G in FIG. 14.

The electrical cable holder 10, broadly divided, has the following parts, as illustrated in FIGS. 3 and 4.

The following (1) and (2) are to be described.

(1) Holder body 60

(2) Movable arm 70

The parts of the electrical cable holder 10 are not limited to the above (1) and (2).

(Holder Body 60)

The holder body 60 is fixed to the horizontal crosspiece 52 of the metal stay 50 (attachment-receiving object), and allows provisional placement of the cable 30 (electrical cable), as illustrated in FIG. 1.

The holder body 60 is integrally molded with "PBT" (polybutylene terephthalate) or other thermoplastic resin having excess elasticity and rigidity, integrally with the movable arm 70 to be described. "PBT" has characteristics of being excellent in heat resistance, chemical resistance, electrical characteristics, dimensional stability, and moldability, and being easy to render flame retardant. Also, the holder body 60 is integrally molded with the movable arm 70, but the present invention is not limited to this, and the two may be molded separately and assembled.

The holder body 60, broadly divided, has the following parts, as illustrated in FIGS. 2 to 15.

The following (1) to (3) are to be described.

(1) Fastening part 80

(2) Arm support part 90

(3) Anchor part 100 (fixing means)

The parts of the holder body 60 are not limited to the above (1) to (3).

(Movable Arm 70)

The movable arm 70 is movably supported on the holder body 60, and is for fastening the cable 30 (electrical cable) provisionally placed in the fastening part 80 to be described, between the movable arm and the fastening part 80, as illustrated in FIGS. 1, 3 to 6, and 18.

Also, the movable arm 70 rotates while maintaining a gap with the roof member 40 (structural object) in a state in which the movable arm is most proximal to the roof member 40.

The movable arm 70, broadly divided, has the following parts, as illustrated in FIGS. 3 and 4.

The following (1) and (2) are to be described.

(1) Movable part 110

(2) Lock part 120

The parts of the movable arm 70 are not limited to the above (1) and (2).

(Fastening Part 80)

The fastening part 80 is positioned beneath the anchor part 100 (fixing means) to be described, and allows provisional placement of the cable 30 (electrical cable), as illustrated in FIGS. 1 and 3 to 4, as is to be described.

The fastening part 80 extends downward from one end of the holder body 60, bending in a C-shaped arc form, and a free end is positioned at a distance downward from the other end of the holder body 60, maintaining a gap into which the cable 30 (electrical cable) can be inserted.

The fastening part 80 is bent in a C-shaped arc form, but the present invention is not limited to this, and the fastening part 80 may be bent in a J shape, or may be bent in a rectangular or square shape rather than as an arc.

The fastening part 80 has the following parts, as illustrated in FIGS. 1, 3 to 6, 8, 9, and 13.

The parts of the fastening part 80 are not limited to the following (1) and (2).

(1) Ratchet 81

The ratchet 81 serves as one part of the lock means, is formed along the outer perimeter positioned beneath the fastening part 80, and is positioned with inclined parts oriented toward the free end and upright parts facing away from the inclined parts oriented toward the base end, as illustrated in FIGS. 1, 3 to 6, 8, 9, and 13.

(2) Guide Rib 82

The guide rib 82 projects along the outer perimeter, and is positioned in the center of the width direction of the fastening part 80, and bisects the ratchet 81 in the width direction, as illustrated in FIGS. 1, 3 to 6, 8, 9, 13, 20, and 21. The guide rib 82 is formed in a trapezoidal shape on the end face, becoming more slender going toward the leading end, and both side faces are formed as tapered faces.

Figure 20:
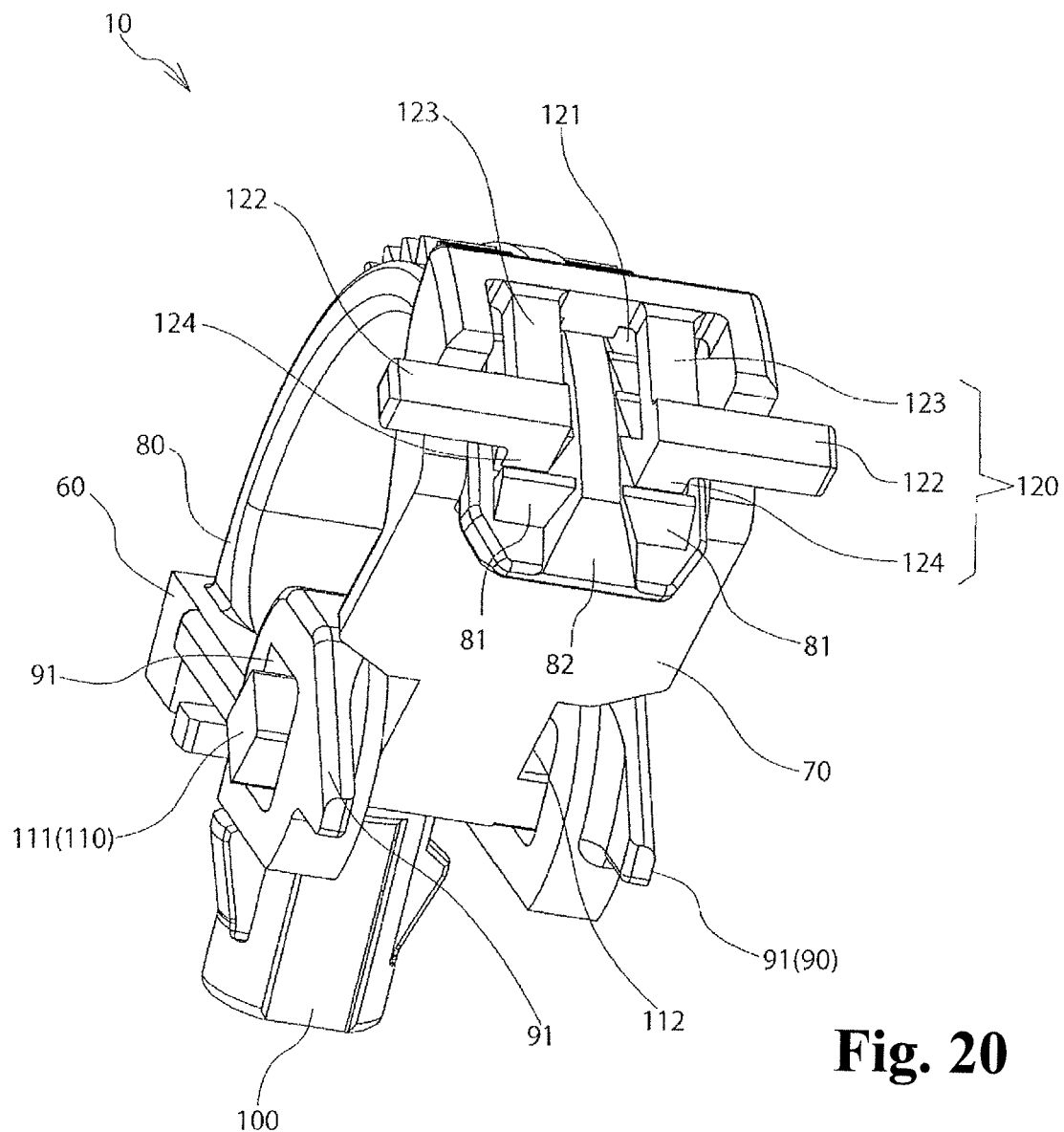
FIG. 20 is a perspective view of the electrical cable holder in the state in which the movable arm on the fastening part is locked.
Figure 21:
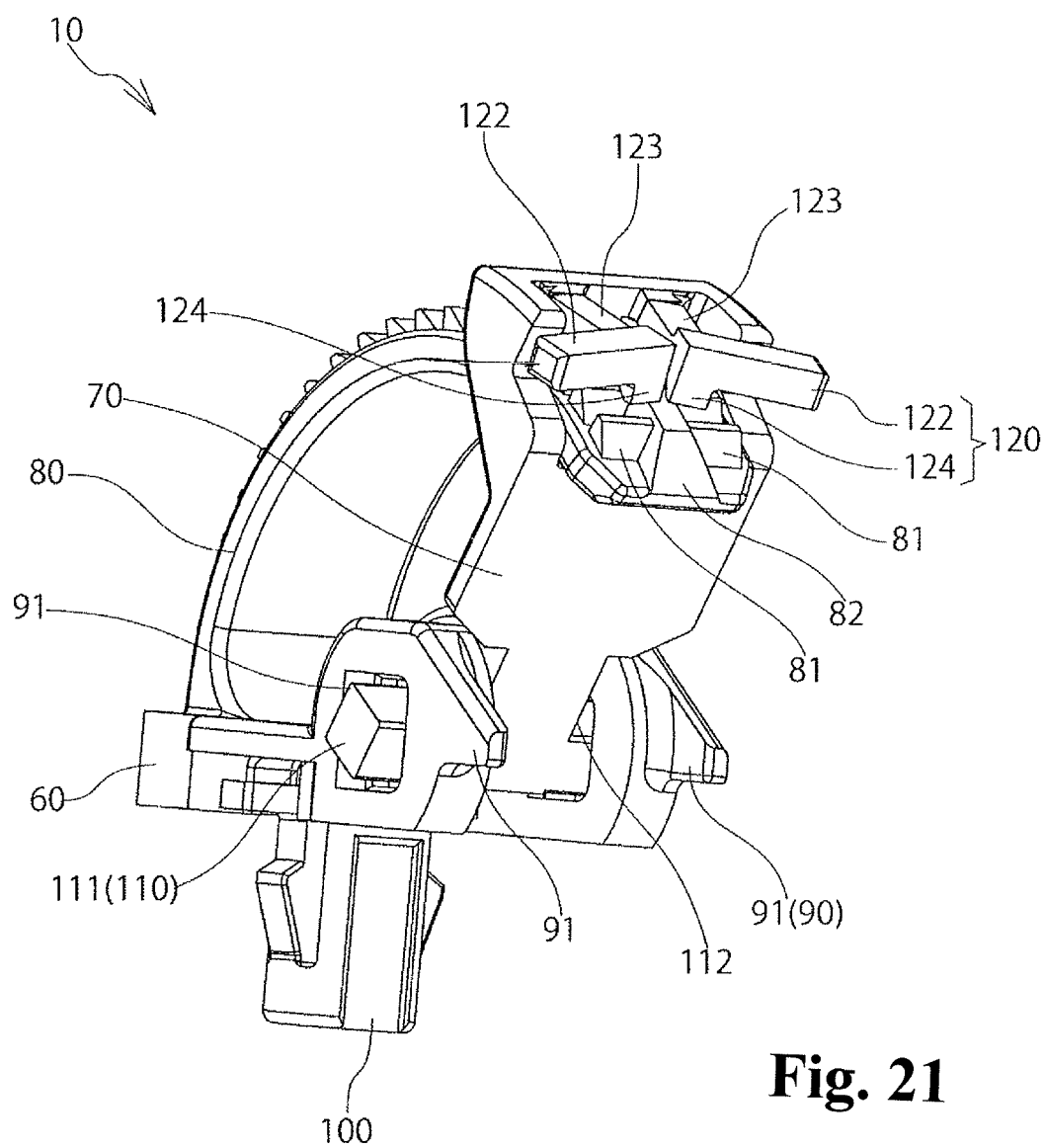
FIG. 21 is a perspective view of the electrical cable holder in the state in which the release arm is operated, corresponding to FIG. 20.

Release arms 122 of the lock part 120 to be described contact with the tapered faces of both side faces of the guide rib 82, as illustrated in FIGS. 20 and 21.

(Arm Support Part 90)

The arm support part 90 is positioned on the other end of the holder body 60 on the opposite side of one end having the fastening part 80 with the anchor part 100 in between, and is for movably supporting the movable part 110 to be described of the movable arm 70, as illustrated in FIGS. 3 and 4.

The arm support part 90, broadly divided, has the following parts, as illustrated in FIGS. 3 and 4.

The parts of the arm support part 90 are not limited to the following (1) and (2).

(1) Support Arm 91

A pair of support arms 91 extends from the other end of the holder body 60 and is formed at a distance in the width direction of the holder body 60, as illustrated in FIGS. 3 and 4. The movable part 110 to be described of the movable arm 70 is inserted inside the interval of the support arms 91.

(2) Shaft Hole 92

Shaft holes 92 are formed respectively on the free ends of the pair of arms 91, and the pair of shaft holes 92 is formed mutually oppositely, as illustrated in FIGS. 3 and 4. The shaft hole 92 runs through the support arm 91 in the thickness direction, and is formed in a square shape. A pair of shaft parts 111 of the movable part 110 to be described is inserted respectively in the pair of shaft holes 92.

The shaft hole 92 is formed in a square shape, but the present invention is not limited to this, and the shaft hole 92 may be formed in a regular polygonal shape other than square shape, and may be formed in a circular shape. Also, the shaft hole 92 is formed on the support arm 91 and the shaft part 111 is formed on the movable arm 70, but the present invention is not limited to this, and, conversely, the shaft part may be formed on the support arm 91 and the shaft hole may be formed on the movable arm 70.

(Anchor Part 100 (Fixing Means))

The anchor part 100 functions as fixing means for fixing to the metal stay 50 (attachment-receiving object), as illustrated in FIGS. 3, 4, and 10 to 12.

A box-anchor-shaped anchor part 100 is illustrated as an example of the fixing means, but the present invention is not limited to this, and a so-called "canoe shape" also is possible.

The anchor part 100, broadly divided, has the following parts, as illustrated in FIGS. 3, 4, and 10 to 12.

The parts of the anchor part 100 are not limited to the following (1) to (3).

(1) Box Part 101

The box part 101 extends upward from the upper face in the center of the length of the holder body 60, and is formed in a cylindrical shape, as illustrated in FIGS. 3, 4, and 10 to 12. The outer diameter of the box part 101 is set equal to or smaller than the inner diameter of the circular attachment hole 54 of the horizontal crosspiece 52.

The box part 101 is formed in a cylindrical shape, but the present invention is not limited to this, and the box part 101 may be formed in a square tubular shape.

(2) Anchor Claw 102

A plurality of anchor claws 102 projects elastically from the outer perimeter of the box part 101, as illustrated in FIGS. 3, 4, and 10 to 12. A pair of anchor claws 102 is provided in the diameter direction of the box part 101, and is formed in a roughly right-triangular shape with an inclined surface oriented upward and a contact surface oriented downward, adjacent to the inclined surface and parallel to the box part 101, for contacting with the horizontal crosspiece 52.

The distance from the contact surface of the anchor claw 102 to the upper face of the box part 101 is set roughly equal to the plate thickness of the horizontal crosspiece 52.

A pair of anchor claws 102 is provided in the diameter direction of the box part 101, but the present invention is not limited to this, and three or more may be provided in a radial form.

(3) Release Lever 103

The release lever 103 is for releasing the locked state of the anchor claw 102, as illustrated in FIGS. 3, 4, and 10 to 12, and extends being bent in an L shape in section from the lower end of the anchor claw 102.

(Movable Part 110)

The movable part 110 is positioned on one end, for example, the upper end, of the arm support part 90, and is movably supported by the arm support 90, as illustrated in FIGS. 3 and 4.

The movable part 110 has the following parts, as illustrated in FIGS. 3 and 4.

The parts of the movable part 110 are not limited to the following (1) and (2).

(1) Shaft Part 111

A pair of shaft parts 111 projects from both ends in the width direction of the movable part 110, and is movably inserted in the shaft holes 92 of the support arms 91, as illustrated in FIGS. 3 and 4.

The shaft part 111 is formed in a square columnar shape, and the external shape is set one size smaller than the internal shape of the square shaft hole 92.

(2) Neck Part 112

Figure 16:
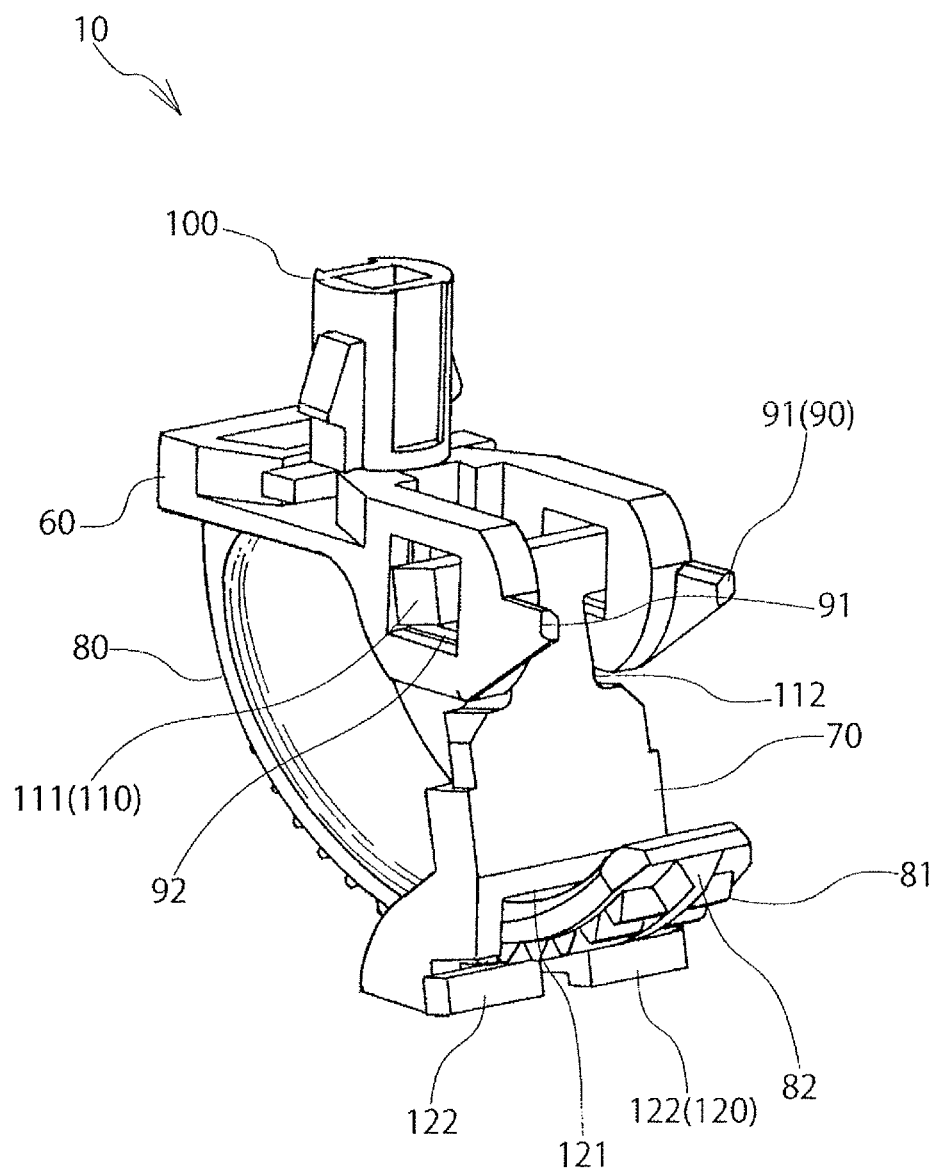
FIG. 16 is a perspective view of the electrical cable holder in the state in which the movable arm is rotated downward, illustrating the first embodiment of the present invention.

The neck part 112 is formed adjacent to the shaft part 111, and is narrowed by reducing the width of the movable arm 70, as illustrated in FIGS. 3, 4, and 16. The width of the neck part 112 is set equal to or greater than the interval between the opposite support arms 91, and in the present embodiment is set equal to the interval between the opposite support arms 91.

Figure 17:
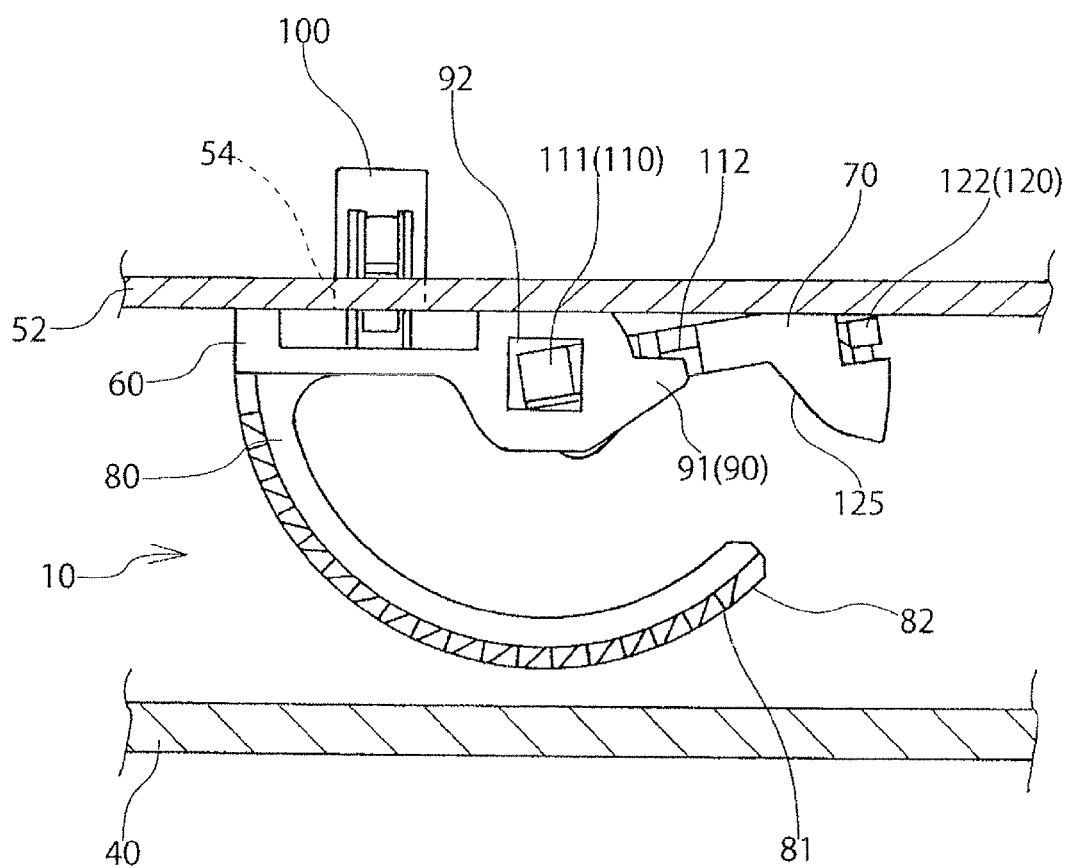
FIG. 17 is a cross-sectional view of the installed state of the electrical cable holder.

In the state having rotated the support arms 91 upward, a gap into which the cable 30 (electrical cable) can be inserted is formed between the lower face of the holder body 60 and the free end of the fastening part 80, as illustrated in FIGS. 1 and 17. At this time, the neck part 112 enters inside the interval between the opposite support arms 91, and the two support arms 91 stand by frictional resistance in the position being rotated upward and function as stationary means.

The stationary means is for maintaining the non-fastening state. The neck part 112 of the support arm 91 is illustrated as an example of the stationary means, but the present invention is not limited to this, and either one of a tongue part and a groove part that fit together may be provided on either one of the holder body 60 and the movable arm 70.

(Lock Part 120)

The lock part 120 is positioned on the other end, for example, the lower end, of the arm support part 90, and is for locking the movable arm 70 in the fastening state in which the cable 30 (electrical cable) is fastened by the fastening part 80, as illustrated in FIGS. 3, 4, 20, and 21.

The lock part 120, broadly divided, has the following parts, as illustrated in FIGS. 3, 4, 20, and 21.

The parts of the lock part 120 are not limited to the following (1) to (5).

(1) Guide Groove 121

The guide groove 121 is formed in a recessed form with the end face open, and moves along the inner perimeter surface of the fastening part 80 when the fastening part 80 is inserted inside the groove and the movable arm 70 is rotated centered on the shaft part 111, as illustrated in FIGS. 3, 4, 20, and 21.

(2) Release Arm 122

The release arm 122 confronts the ratchet 81 formed on the outer perimeter surface of the fastening part 80 from the open-side end face of the guide groove 121, as illustrated in FIGS. 3, 4, 20, and 21. A pair of release arms 122 is formed in the width direction of the movable arm 70, being bent roughly in an L shape overall. The release arms 122 contact with the tapered faces on both side faces of the guide rib 82, and ascend in the direction moving away from the ratchet 81 while approaching each other when manually operated, and at this time, a lock claw 124 to be described is decoupled from the ratchet 81.

(3) Connecting Part 123

The connecting part 123 elastically connects the other end of the arm support part 90 and the release arm 122, as illustrated in FIGS. 3, 4, 20, and 21. The release arm 122 is urged in the direction approaching the ratchet 81 by an elastic return force of the connecting part 123.

(4) Lock Claw 124

The lock claw 124 is bent roughly in an L shape toward the ratchet 81 from the end of the release arm 122, and is inserted into one tooth of the ratchet 81, as illustrated in FIGS. 3, 4, 20, and 21.

(5) Contact Part 125

The contact part 125 contacts with the cable 30 (electrical cable) provisionally placed in the fastening part 80, and the inner face opposite the cable 30 is bent roughly in a V shape or roughly in an L shape along the outer perimeter of the cable 30, as illustrated in FIGS. 3, 4, 18, and 19.

(Method of Use of the Electrical Cable Holder 10)

The method of use of the electrical cable holder 10 having the above configuration is next described.

First, the electrical cable holder 10 is positioned inside the interval between the roof member 40 (structural object) and the horizontal crosspiece 52, and the anchor part 100 is inserted from beneath in an aligned manner into the attachment hole 54 of the horizontal crosspiece 52, as illustrated in FIG. 17. By thus fixing in the horizontal crosspiece 52, the electrical cable holder 10 is placed inside the interval between the roof member 40 (structural object) and the horizontal crosspiece 52.

At this time, the outer perimeter of the fastening part 80 of the electrical cable holder 10 is positioned at a distance upward from the upper face of the roof member 40 (structural object), as illustrated in FIG. 17.

Next, cables 30 (electrical cables) are provisionally placed in the fastening part 80 of the electrical cable holder 10 and are wired, as illustrated in FIG. 1.

After wiring the cables, the movable arm 70 is rotated on the shaft part 111 as the center, as illustrated in FIG. 18.

When the movable arm 70 is rotated downward, the fastening part 80 is inserted into the guide groove 121, and the lock claw 124 is inserted into a tooth of the ratchet 81, as illustrated in FIG. 20.

In this state, the open face between the free end of the fastening part 80 and the lower face of the holder body 60 is closed by the movable arm 70, as illustrated in FIG. 18.

Next, when the movable arm 70 is rotated further, the cables 30 are pushed toward the depth of the fastening part 80 by the contact part 125, as illustrated in FIG. 18.

At this time, the lock claw 124 is pushed up by the front face of the tooth of the ratchet 81, and advances riding over the tooth toward the depth of the fastening part 80.

Also, the movable arm 70 rotates while maintaining a gap with the roof member 40 in the state being most proximal to the roof member 40.

When the hand is released at a position where the movable arm 70 can no longer rotate due to being pressed by the cables 30, the rotation in the returning direction of the movable arm 70 is checked by the engagement between the lock claw 124 and the tooth of the ratchet 81, as illustrated in FIG. 20, and the cables 30 are fastened by the inner perimeter surface of the fastening part 80, the contact part 125 of the movable arm 70, and the lower face of the holder body 60, as illustrated in FIG. 18.

Also, at this time, a counterforce of the cables 30 acts on the movable arm 70, the square part of the square columnar shaft part 111 elastically contacts with the edges of the square shaft hole 92 as illustrated in FIG. 18, and rattling between the two is prevented.

That is, although not illustrated, the counterforce acts by an elastic return force of insulating vinyl or another insulator provided as a cover on the outer perimeters of the cables 30.

Meanwhile, in the case when changing the wiring of the cables 30, the pair of release arms 122 is pushed by hand in the direction of approaching each other, as illustrated in FIG. 21.

When pushed, the release arms 122 contact with the tapered faces of both side faces of the guide rib 82.

When pushed further, the release arms 122 float up in the direction moving away from the ratchet 81 while approaching each other, and at this time, the lock claw 124 decouples from the ratchet 81, as illustrated in FIG. 21.

At this time, the movable arm 70 is rotated upward while pushing the release arm 122, whereby the movable arm 70 can be pulled out from the free end of the fastening part 80.

The movable arm 70 is pulled out, whereby the open face between the free end of the fastening part 80 and the lower face of the holder body 60 is opened as illustrated in FIG. 1, the cables 30 can be taken out from the open face and new cables 30 can be inserted and provisionally placed in the fastening part 80.

The neck part 112 of the upward-rotated movable arm 70 enters inside the interval between the opposite support arms 91, and the two support arms 91 stand by frictional resistance in the position being rotated upward.

Therefore, the movable arm 70 can be prevented from rotating downward and closing the open face between the free end of the fastening part 80 and the lower face of the holder body 60 in midcourse of wiring of the cables.

Second Embodiment

Figure 22:
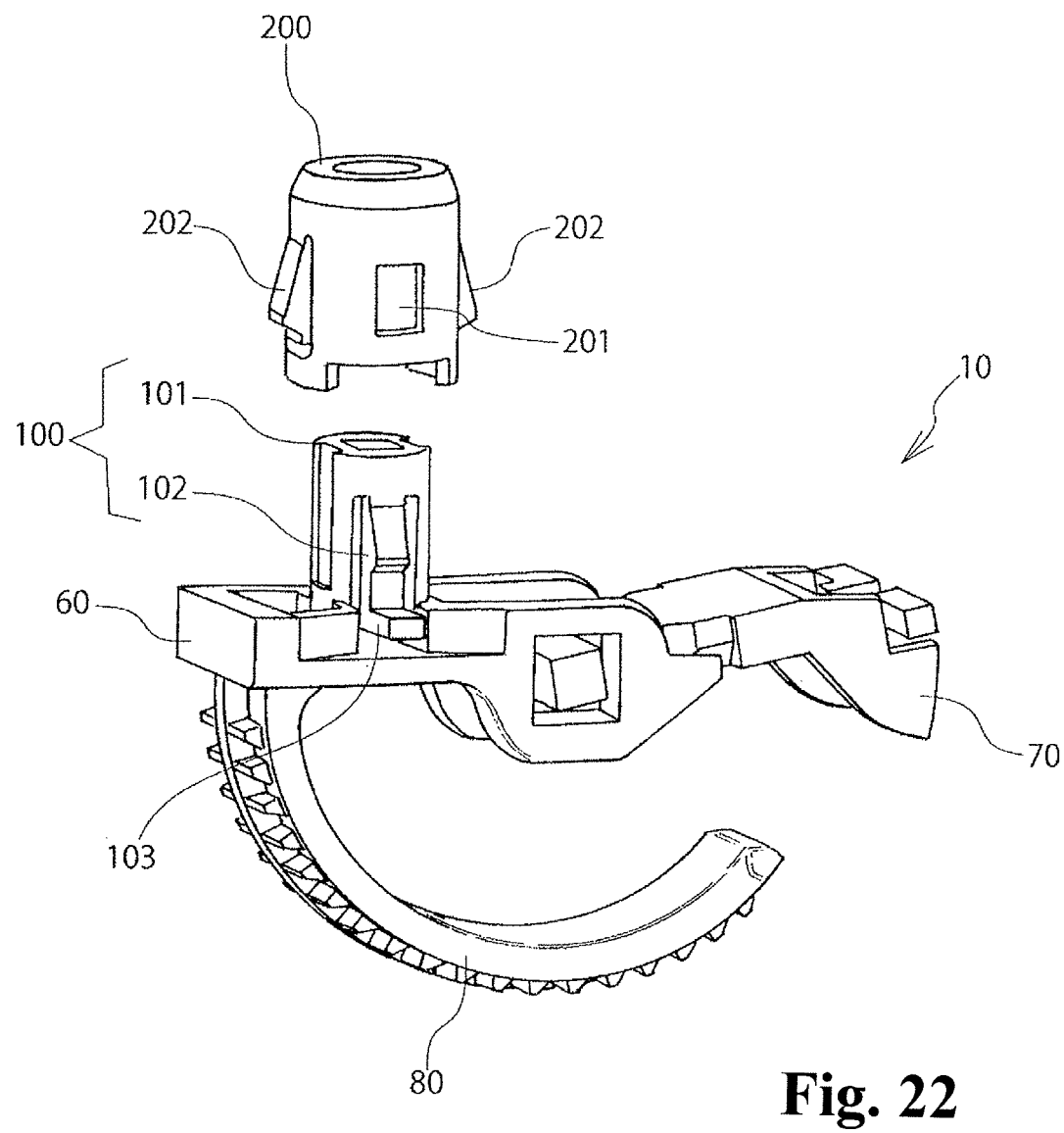
FIG. 22 is a perspective view of the electrical cable holder and the attachment, illustrating the second embodiment of the present invention.

A second embodiment of the present invention is next described using FIG. 22.

A characteristic of the present embodiment is that an attachment 200 is attached to the anchor part 100 (fixing means), as illustrated in FIG. 22.

The attachment 200 is formed in a cylindrical shape with the inner diameter being about equal to the outer diameter of the box part 101 of the anchor part 100, as illustrated in FIG. 22.

The outer diameter of the attachment 200 is formed one size larger than the outer diameter of the box part 101.

A pair of openings 201, into which the anchor claws 102 of the box part 101 are inserted, is provided on the attachment 200, running through the inner and outer perimeters. Also, anchor claw 202 (a part of the lock means) is provided on the attachment 200 at a 90-degree phase difference with the openings 201.

In the description of the present embodiment, the same symbols are used for the same constituent parts as in the first embodiment previously described using FIGS. 1 to 21, and the descriptions are omitted.

According to the present embodiment, by installing the attachment 200 in the anchor part 100, the anchor part 100 can be attached in an attachment hole (not illustrated) that is one size larger than the attachment hole 54 illustrated in FIG. 1.

Therefore, attachment holes (not illustrated) having various hole diameters can be accommodated by preparing attachments 200 having different outer diameters.

Also, the contact surface of the anchor claw 202 is positioned at a distance roughly equal to the plate thickness of the horizontal crosspiece 52 from the upper face of the box part 101.

Therefore, variation of thickness of horizontal crosspieces (not illustrated) also can be flexibly accommodated by preparing attachments 200 formed with anchor claws 202 having different heights.

Furthermore, the material of the attachment 200 can be made with a material that is different from that of the electrical cable holder 10, for example, soft resin.

Third Embodiment

Figure 23:
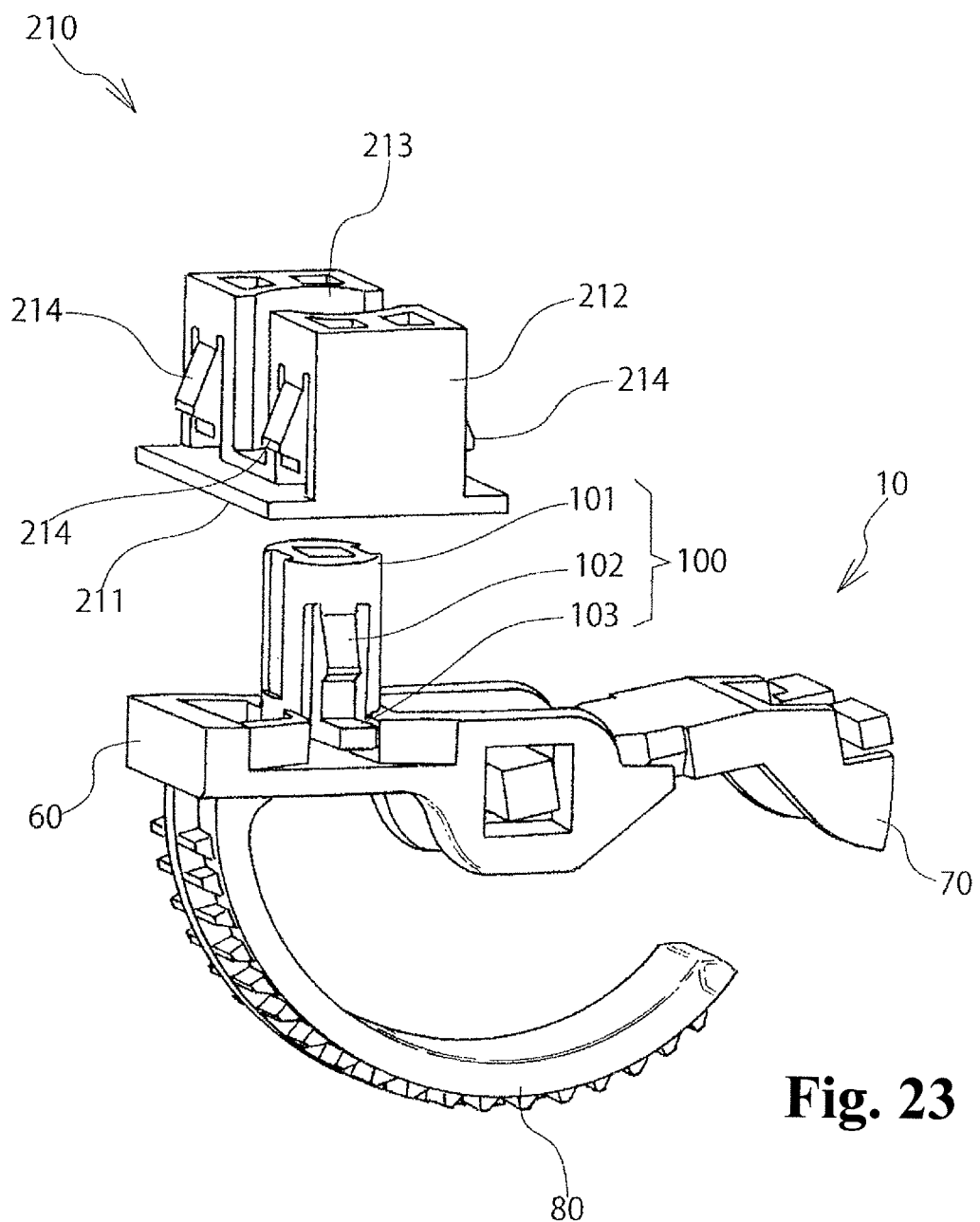
FIG. 23 is a perspective view of the electrical cable holder and the attachment illustrating the third embodiment of the present invention.

A third embodiment of the present invention is next described using FIG. 23.

A characteristic of the present embodiment is that the external shape of an attachment 210 is formed in a box shape overall, as illustrated in FIG. 23.

The attachment 210 is configured with a handle part 211, and two block parts 212 projecting upward from the upper face of the handle part 211, as illustrated in FIG. 23.

The two block parts 212 are formed in square tubular shapes, and are positioned at a distance maintaining a gap 213 into which the box part 101 of the anchor 100 is inserted. Although not illustrated, the handle part 211 has a through-hole running through the gap 213 for the anchor part 100, and the box part 101 is inserted inside the gap 213 between the two block parts 212 through the through-hole. Although not illustrated, a pair of openings, into which the anchor claws 102 of the box part 101 are inserted, is provided on the opposite inside faces of the box part 101, running through inside and out.

Also, anchor claws 214 are provided on the outside faces of the two block parts 212 at a 90-degree phase difference with the openings.

In the description of the present embodiment, the same symbols are used for the same constituent parts as in the first embodiment previously described using FIGS. 1 to 21, and the descriptions are omitted.

According to the present embodiment, by installing the attachment 210 on the anchor part 100, the anchor part 100 can be attached to a square attachment hole (not illustrated) rather than the circular attachment hole 54 illustrated in FIG.

1. The box-shaped attachment 210 is accessory to the electrical cable holder 10, and although not illustrated, is used mainly when fixing to a mount, for example, a metal stay 50, for attaching a solar panel 20.

The entire contents of the specification, claims, drawings, and abstract of Japanese Patent Application No. 2010-222564 filed on Sep. 30, 2010 are incorporated by reference herein as a disclosure of the specification of the present invention.

What is claimed is:

1. An electrical cable holder for fixing an electrical cable on an attachment-receiving-object, comprising:
   a holder body having a fixing device for fixing to the attachment-receiving object, a fastening part extending downwardly from one end portion thereof to form a C-shaped arc and positioned below the fixing device for placing the electrical cable thereinside, a free end of the C-shaped arc being arranged below another end portion of the holder body to maintain a gap therebetween for inserting the electrical cable therethrough, and including one of a shaft part or a shaft hole; and
   a movable arm including another of the shaft hole or the shaft part engaging the one of the shaft part or the shaft hole of the holder body to be movably supported on the holder body for fastening the electrical cable placed in the fastening part, between the movable arm and the fastening part,
   wherein a lock device for locking the movable arm in a fastening state where the electrical cable is fixed on the fastening part, is provided between the movable arm and the fastening part;
   a stationary device for maintaining a non-fastening state is provided between the holder body and the movable arm;
   the holder body includes an arm support part formed on the another end portion thereof and having a pair of support arms apart from each other to form an interval therebetween, and the movable arm includes a neck part having a width equal to or greater than the interval between the pair of support arms; and
   the pair of support arms and the neck part form the stationary device, and the neck part is held inside the interval between the pair of support arms so that the movable arm is frictionally retained at a position away from the fastening part.

2. A combination comprising:
   the electrical cable holder according to claim 1, and
   the attachment-receiving object,
   wherein the attachment-receiving object is provided with an attachment hole for fixing the fixing device; and
   the fixing device includes an attachment member accommodated in the attachment hole.

3. The electrical cable holder according to claim 1, wherein the shaft part and the shaft hole contact closely to each other in the fastening state.

4. The electrical cable holder according to claim 1, wherein the holder body includes the shaft hole at the another end portion thereof, and the movable arm includes the shaft part at one end portion thereof; and
   the neck part has a reduced width at the movable arm and arranged adjacent to the shaft part, and the pair of support arms protrudes outwardly in a direction opposite to the fixed device.

5. The electrical cable holder according to claim 4, wherein the fastening part includes a ratchet having a plurality of tooth portions protruding from an outer surface thereof and arranged apart from each other along an outer perimeter thereof, and the movable arm includes a lock part formed at another end portion thereof and having a lock claw protruding outwardly to engage one of the plurality of tooth portions; and the ratchet of the fastening part and the lock claw form the lock device.

6. The electrical cable holder according to claim 5, wherein the fastening part includes a guide rib protruding outwardly from the outer surface thereof and formed on a center portion in a width direction thereof to bisect the plurality of tooth portions in the width direction, and the guide rib includes tapered faces formed at two side portions thereof and tapered in a direction away from the outer surface of the fastening part; and the lock part includes release arms connecting the lock claw and extending outwardly in a width direction of the movable arm such that the release arms contact the tapered faces to detach the lock claw from the one of the plurality of tooth portions.

7. A combination comprising:
   an electrical cable holder for fixing to an attachment-receiving object an electrical cable wired between stationary objects arranged above a structural object with a space therebetween, comprising:
      a holder body having a fixing device for fixing to the stationary object, and a fastening part positioned below the fixing device for placing the electrical cable; and
      a movable arm supported rotatably on the holder body, for fastening the electrical cable provisionally placed in the fastening part, between the movable arm and the fastening part,
      wherein a lock device for locking the movable arm in a fastening state, in which the electrical cable is fastened on the fastening part, is provided between the movable arm and the fastening part, and the lock device includes a ratchet formed along an outer perimeter at a lower side thereof and having a plurality of tooth portions, a lock claw bent toward the ratchet to engage one of the plurality of tooth portions of the ratchet, and a release arm connecting the lock claw;
      the lock claw is bent from an end of the release arm; and
      the movable arm is arranged to rotate to maintain a gap with the structural object in a state in which the movable arm is most proximal to the structural object;
   the structural object and the stationary objects arranged above and spaced from the structural object,
   wherein the structural object is a roof member; and
   the stationary object is a solar panel or a mount for attaching the solar panel.

* * * * *